(12) United States Patent
Chang et al.

(10) Patent No.: US 12,300,536 B2
(45) Date of Patent: May 13, 2025

(54) GLUE LAYER ETCHING FOR IMPROVING DEVICE PERFORMANCE AND PROVIDING CONTACT ISOLATION

(71) Applicant: Taiwan Semiconductor Manufacturing Co., Ltd., Hsinchu (TW)

(72) Inventors: Chia-Hao Chang, Hsinchu (TW); Jia-Chuan You, Hsinchu (TW); Li-Zhen Yu, Hsinchu (TW); Lin-Yu Huang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 362 days.

(21) Appl. No.: 17/477,333

(22) Filed: Sep. 16, 2021

(65) Prior Publication Data
US 2022/0352015 A1 Nov. 3, 2022

Related U.S. Application Data

(60) Provisional application No. 63/182,483, filed on Apr. 30, 2021.

(51) Int. Cl.
*H01L 21/768* (2006.01)
*H01L 23/522* (2006.01)
*H10D 30/62* (2025.01)
*H10D 62/13* (2025.01)

(52) U.S. Cl.
CPC .. *H01L 21/76831* (2013.01); *H01L 21/76843* (2013.01); *H01L 21/76877* (2013.01); *H01L 23/5226* (2013.01); *H10D 30/6211* (2025.01); *H10D 30/6219* (2025.01); *H10D 62/151* (2025.01)

(58) Field of Classification Search
CPC ......... H01L 21/76831; H01L 21/76843; H01L 21/76877; H01L 23/5226; H01L 29/0847; H01L 29/41791; H01L 29/7851; H01L 23/485; H01L 21/76883; H01L 21/76844; H01L 21/76885; H01L 21/76829; H01L 21/76834; H01L 21/823418; H01L 21/823475; H01L 27/088
See application file for complete search history.

(56) References Cited

U.S. PATENT DOCUMENTS

| | | | |
|---|---|---|---|
| 10,211,094 B2* | 2/2019 | Niimi | H01L 21/7685 |
| 2017/0338321 A1* | 11/2017 | Hurwitz | H03K 17/693 |
| 2019/0148226 A1* | 5/2019 | Yim | H01L 29/6656 |
| | | | 257/383 |
| 2021/0057533 A1* | 2/2021 | Hwang | H01L 21/28518 |
| 2021/0066200 A1* | 3/2021 | Park | H10B 12/485 |
| 2021/0375722 A1* | 12/2021 | Kim | H01L 21/76898 |
| 2022/0069078 A1* | 3/2022 | Yu | H01L 29/0673 |

* cited by examiner

*Primary Examiner* — Yasser A Abdelaziez
(74) *Attorney, Agent, or Firm* — Seed IP Law Group

(57) ABSTRACT

A semiconductor device with reduced contact resistance is provided. The semiconductor device includes a substrate having a channel region and a source/drain region, a source/drain contact structure over the source/drain region, a conductive structure over the source/drain contact structure, an interlayer dielectric (ILD) layer surrounding the conductive structure and source/drain contact structure, a dielectric liner between the ILD layer and the conductive structure, and a diffusion barrier between the dielectric liner and the conductive structure.

20 Claims, 17 Drawing Sheets

GLUE LAYER ETCHING FOR IMPROVING DEVICE PERFORMANCE AND PROVIDING CONTACT ISOLATION

PRIORITY CLAIM AND CROSS-REFERENCE

This application claims the benefit of U.S. Provisional Patent Application No. 63/182,483, filed Apr. 30, 2021, which is incorporated by reference herein in its entirety.

BACKGROUND

The semiconductor integrated circuit (IC) industry has experienced rapid growth. Technological advances in IC materials and design have produced generations of ICs. In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs. However, since the feature sizes continue to decrease, fabrication processes continue to become more difficult to perform. Therefore, it is a challenge to form reliable semiconductor devices with smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
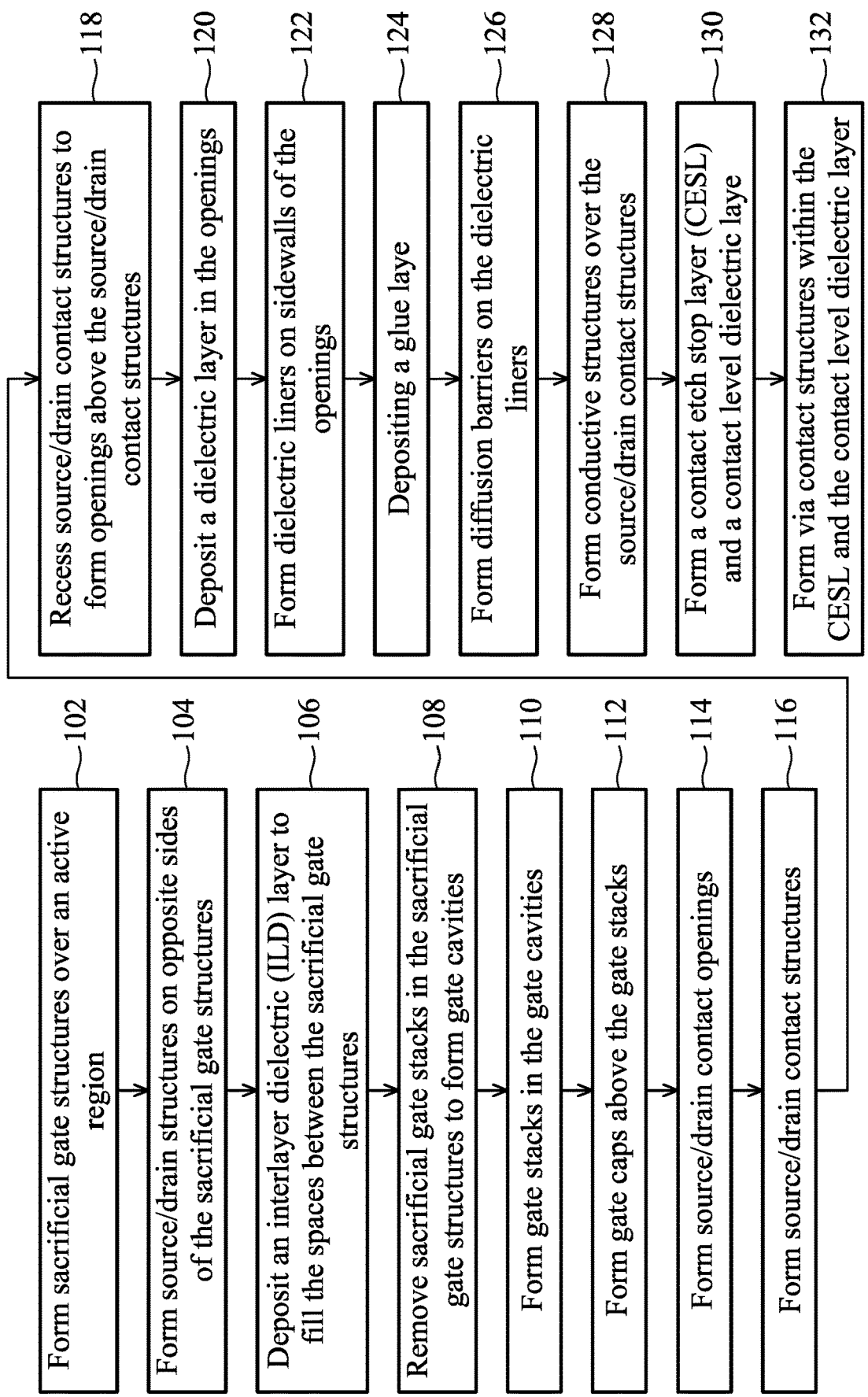
FIG. 1 is a flowchart illustrating a method for fabricating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the manufacturing of ICs, devices such as field effect transistors (FETs), diodes and resistors may be formed on a substrate (e.g., a silicon substrate) and connected together using one or more metallization layers. The one or more metallization layers may include vias and interconnects that function as electrical connections to interconnect the devices. Contacts may be used to connect the vias and interconnects to elements (e.g., source/drain) of FETs.

Typically, the formation of a contact includes forming a contact opening in a dielectric layer, and filling a conductive metal in the contact opening. To prevent metals from diffusion into the surrounding dielectric layer, before depositing the metal, a glue layer is formed on the sidewalls and bottom of the contact opening. The glue layer limits electron migration (EM) and time-dependent dielectric breakdown associated with the metal diffusion, thereby increasing device reliability. However, the presence of the glue layer at the bottom surface of the contact opening, i.e., at the interfaces between the contacts of different levels, leads to an increase in contact resistance, which greatly degrades the device performance.

In embodiments of the present disclosure, to reduce the contact resistance, after depositing a glue layer, an etching process is performed to remove the glue layer from the bottom surface of a contact opening, and at the same time to reduce the thickness of the glue layer on sidewalls of the contact opening. The glue layer etching helps to reduce the contact resistance, which in turn leads to increased device performance.

Figure 2A:
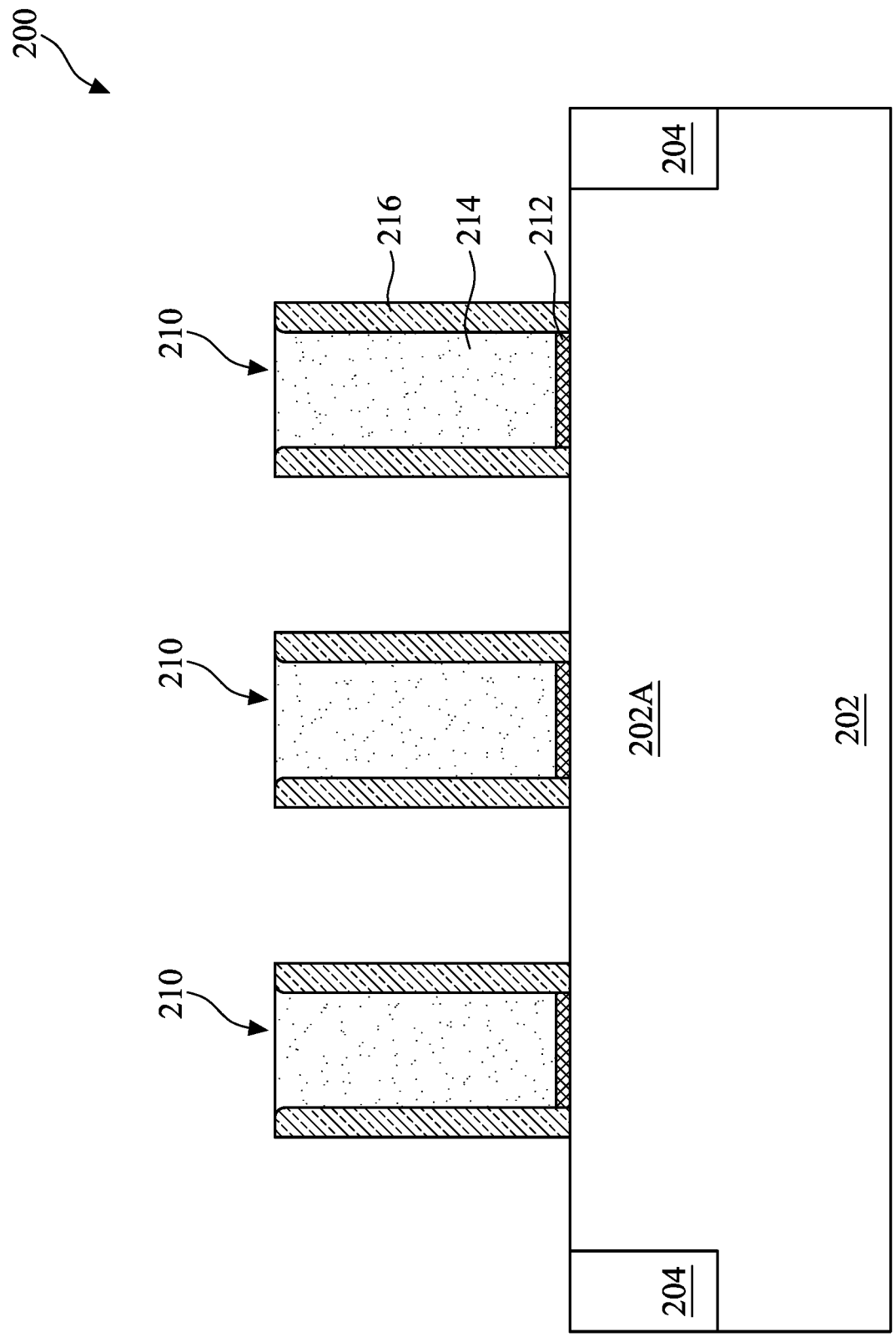
FIG. 2A to FIG. 2P are cross-sectional views of a semiconductor device at various fabrication stages of the method of FIG. 1, in accordance with some embodiments.

FIG. 1 is a flowchart of a method 100 for fabricating a semiconductor device 200, in accordance with various aspects of the present disclosure. FIGS. 2A-2P are cross-sectional views of the semiconductor device 200 in various stages of a manufacturing process, in accordance with some embodiments. The method 100 is discussed in detail below, with reference to the semiconductor device 200, in FIGS. 2A-2I. In some embodiments, additional operations are performed before, during, and/or after the method 100, or some of the operations described are replaced, and/or eliminated. In some embodiments, additional features are added to the semiconductor device 200. In some embodiments, some of the features described below are replaced or eliminated. One of ordinary skill in the art would understand that although some embodiments are discussed with operations performed in a particular order, these operations may be performed in another logical order.

Some embodiments, such as those described herein, relate to fin field effect transistors (FinFETs). A FinFET refers to any fin-based, multi-gate transistor. Some other embodiments, such as those described herein, relate to planar field effect transistors. Still some other embodiments, such as those described herein, relate to nanowire or nanosheet field effect transistors.

Referring to FIGS. 1 and 2A, the method 100 includes operation 102, in which sacrificial gate structures 210 are formed over an active region 202A of a substrate 202, in accordance with some embodiments. FIG. 2A is a cross-sectional view of the semiconductor device 200 after forming the sacrificial gate structures 210 over the active region 202A of the substrate 202, in accordance with some embodiments.

In some embodiments, the substrate 202 is a bulk semiconductor substrate. A "bulk" semiconductor substrate refers to a substrate that is entirely composed of at least one semiconductor material. In some embodiments, the bulk semiconductor substrate includes a semiconductor material or a stack of semiconductor materials such as, for example, silicon (Si), germanium (Ge), silicon germanium (SiGe), carbon doped silicon (Si:C), silicon germanium carbon (SiGeC); or an III-V compound semiconductor such as, for example, gallium arsenide (GaAs), gallium phosphide (GaP), indium phosphide (InP), indium arsenide (InAs), indium antimonide (InSb), gallium arsenide phosphide (GaAsP), aluminum indium arsenide (AlInAs), aluminum gallium arsenide (AlGaAs), gallium indium arsenide (GaInAs), gallium indium phosphide (GaInP), or gallium indium arsenide phosphide (GaInAsP). In some embodiments, the bulk semiconductor substrate includes a single crystalline semiconductor material such as, for example, single crystalline silicon. In some embodiments, the bulk semiconductor substrate is doped depending on design requirements. In some embodiments, the bulk semiconductor substrate is doped with p-type dopants or n-type dopants. The term "p-type" refers to the addition of impurities to an intrinsic semiconductor that creates deficiencies of valence electrons. Exemplary p-type dopants, i.e., p-type impurities, include, but are not limited to, boron, aluminum, gallium, and indium. "N-type" refers to the addition of impurities that contribute free electrons to an intrinsic semiconductor. Exemplary n-type dopants, i.e., n-type impurities, include, but are not limited to, antimony, arsenic, and phosphorous. If doped, the substrate 202, in some embodiments, has a dopant concentration in a range from $1.0 \times 10^{14}$ atoms/cm$^3$ to $1.0 \times 10^{17}$ atoms/cm$^3$, although the dopant concentrations may be greater or smaller. In some embodiments, the substrate 202 is a semiconductor-on-insulator (SOI) substrate including a top semiconductor layer formed on an insulator layer (not shown). The top semiconductor layer includes the above-mentioned semiconductor material such as, for example, Si, Ge, SiGe, Si:C, SiGeC; or an III-V compound semiconductor including GaAs, GaP, InP, InAs, InSb, GaAsP, AlInAs, AlGaAs, GaInAs, GaInP, or GaInASP. The insulator layer is, for example, a silicon oxide layer, or the like. The insulator layer is provided over a base substrate, typically a silicon or glass substrate.

Isolation structures 204 are formed in the substrate 202 to isolate active region 202A from other active regions (not shown) of the semiconductor device 200. In some embodiments, the active region 202A has a planar structure formed in an upper portion of the substrate 202 for formation of planar FETs. In some other embodiments, the active region 202A is a fin protruding upwardly from a base portion of the substrate 202 for formation of FinFETs. The fin may be formed by lithography and etching. In some embodiments, a photoresist layer is applied on the substrate 202 and patterned to provide a patterned photoresist layer atop the substrate 202. The pattern in the patterned photoresist layer is then transferred into the substrate 202 by an anisotropic etch to provide the fin(s). In some embodiments, the etching process used for pattern transfer includes a dry etch such as, for example, reactive ion etch (ME), plasma etch, ion beam etch or laser ablation. After transferring the pattern into the substrate 202, the patterned photoresist layer is removed utilizing a resist stripping process such as, for example, ashing. In some embodiments, other methods such as sidewall image transfer (SIT) or directional self-assembly (DSA) are used to form the fin(s).

The active region 202A is surrounded by isolation structures 204. The isolation structures 204 may be formed of silicon oxide, silicon nitride, silicon oxynitride, fluoride-doped silicate glass (FSG), a low-k dielectric material, and/or other suitable insulating material. In some embodiments, the isolation structures 204 may be shallow trench isolation (STI) structures. In some embodiments, the isolation structures 204 may be formed by etching trenches in the substrate 202, for example, as part of the fin formation process, and then filling trenches with one or more insulator materials using suitable deposition processes such as, for example, chemical vapor deposition (CVD), physical vapor deposition (PVD), or atomic layer deposition (ALD). Next, a chemical mechanical planarization (CMP) process is performed to remove excessive insulator materials and planarize top surfaces of the isolation structures 204. In some embodiments, the isolation structures 204 are formed by oxidization or nitridation of portions of the substrate 202. In some embodiments, the isolation structures 204 have top surfaces coplanar with the top surface of the active region 202A. In instances where the active region 202A is a fin, the deposited insulator material is etched back to physically expose the upper portion of the fin. In some embodiments, a wet etch employing an etching chemical such as, for example, dilute hydrofluoric acid, may be used to etch the insulator material. Accordingly, the isolation structures 204 surround a bottom portion of the fin. In some embodiments, the isolation structures 204 may include a multi-layer structure, for example, having one or more thermal oxide linker layers.

Each of the sacrificial gate structures 210 includes a sacrificial gate stack (212, 214) over a portion of the active region 202A and gate spacers 216 on sidewalls of the sacrificial gate stack (212, 214). In instances where the active region 202A is a planar active region, each sacrificial gate structure 210 is formed atop the active region 202A. In instances where the active region 202A is a fin, each sacrificial gate structure 210 straddles a portion of the active region 202A such that the sacrificial gate structure 210 is formed atop and along sidewalls of the active region 202A. The sacrificial gate stacks (212, 214) will be replaced later by metal gate stacks after high temperature thermal processes, such as thermal annealing for source/drain activation during the sour/drain formation.

The sacrificial gate stack (212, 214) includes a sacrificial gate dielectric 212 and a sacrificial gate conductor 214 over the sacrificial gate dielectric 212. In some embodiments, the sacrificial gate stack (212, 214) may also include a sacrificial gate cap (not shown) over the sacrificial gate conductor. In some embodiments, the sacrificial gate dielectric 212 is omitted. In some embodiments, the sacrificial gate stack (212, 214) is formed by providing a sacrificial material stack (not shown) that includes a sacrificial gate dielectric layer and a sacrificial gate conductor layer over the substrate 202, and then patterning the sacrificial material stack.

In some embodiments, the sacrificial gate dielectric layer includes silicon oxide, silicon nitride, or silicon oxynitride. In some embodiments, the sacrificial gate dielectric layer is formed utilizing a deposition process such as, for example, CVD or PVD. In some embodiments, the sacrificial gate dielectric layer is formed by conversion of a surface portion of the active region 202A utilizing thermal oxidation or nitridation.

In some embodiments, the sacrificial gate conductor layer includes polysilicon. In some embodiments, the sacrificial gate conductor layer is formed utilizing a deposition process such as, for example, CVD, plasma enhanced chemical vapor deposition (PECVD), or PVD.

In some embodiments, the sacrificial gate material stack is patterned by lithography and etching. For example, a photoresist layer is applied over the topmost surface of the sacrificial material stack and lithographically patterned by exposure and development. The pattern in the photoresist layer is sequentially transferred into the sacrificial material stack by at least one anisotropic etch. The anisotropic etch may be a dry etch such as RIE, a wet etch, or a combination thereof. If not completely consumed, the remaining photoresist layer after formation of the sacrificial gate stack is removed by, for example, ashing.

In some embodiments, the gate spacers 216 may include a dielectric material such as, for example, an oxide, a nitride, an oxynitride, or combinations thereof. In some embodiments, the gate spacers 216 include silicon nitride. In some embodiments, the gate spacers 216 are formed by first depositing a conformal gate spacer material layer on exposed surfaces of the sacrificial gate stack (212, 214), the active regions 202A, and the isolation structures 204 and then etching the gate spacer material layer to remove horizontal portions of the gate spacer material layer. In some embodiments, the gate spacer material layer is deposited, for example, by CVD, PECVD, or ALD. In some embodiments, the gate spacer material layer is etched by a dry etch such as, for example, RIE. Remaining vertical portions of the gate spacer material layer on the sidewalls of sacrificial gate stacks (212, 214) constitute the gate spacers 216.

Figure 2B:
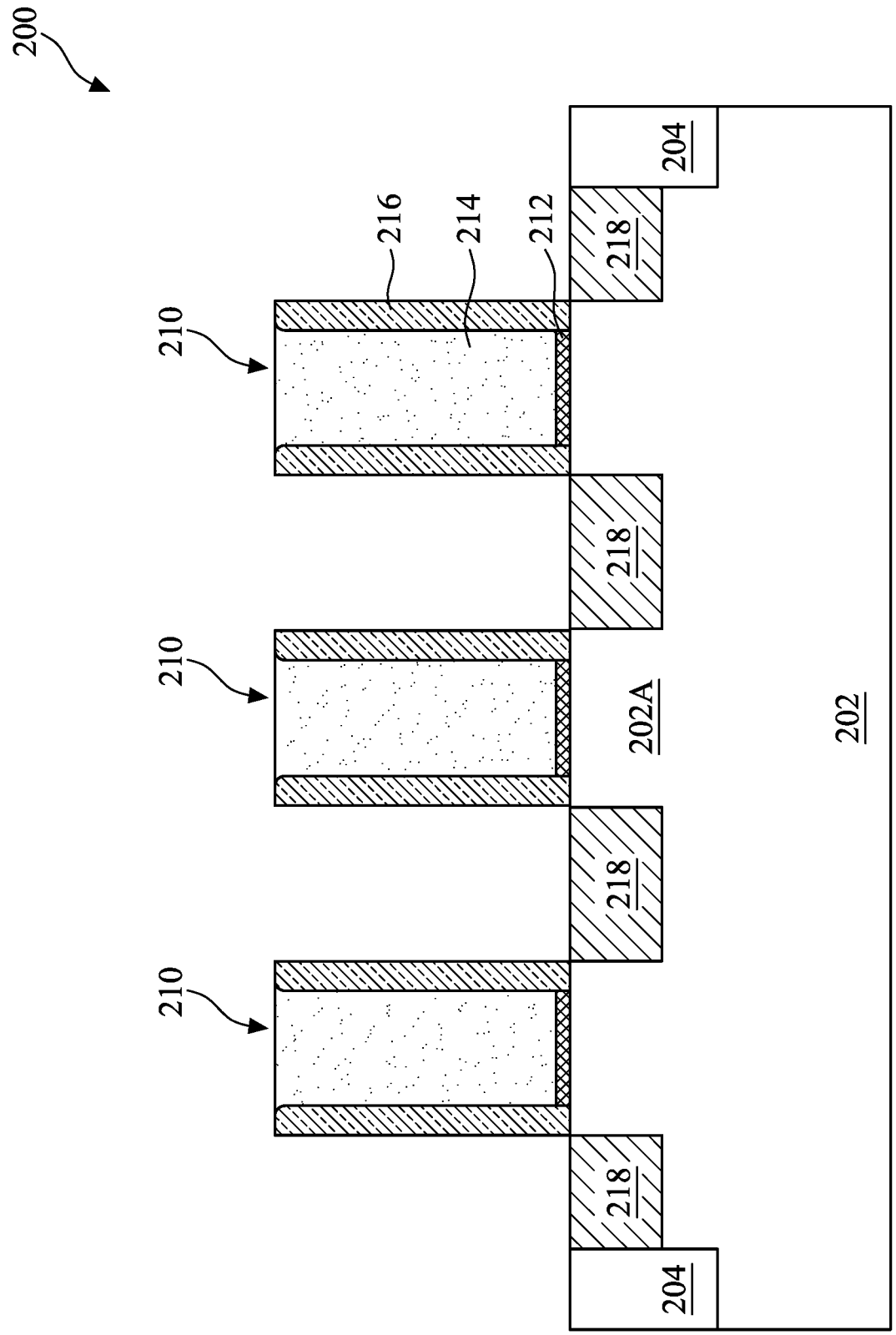

Referring to FIGS. 1 and 2B, the method 100 proceeds to operation 104, in which source/drain regions 218 are formed on opposite sides of the sacrificial gate structures 210, in accordance with some embodiments. FIG. 2B is a cross-sectional view of the semiconductor device 200 of FIG. 2A after forming the source/drain regions 218 on the opposite sides of the sacrificial gate structures 210, in accordance with some embodiments.

The source/drain regions 218 are formed in portions of the active region 202A that are not covered by the sacrificial gate structures 210. Here, a source/drain region functions as either a source or a drain for a FET depending on the wiring of the FET.

The source/drain regions 218 are doped semiconductor structures. In some embodiments, the source/drain regions 218 include a semiconductor material such as, for example, Si, SiGe, Si:C, Ge, or an III-V material such as GaAs, InP, GaP, or GaN. The source/drain regions 218 contains dopants of appropriate conductivity types. In some embodiments, the source/drain regions 218 may contain n-type dopants for formation of n-type FETs. In some other embodiments, the source/drain regions 218 may contain p-type dopants for formation of p-type transistors. The dopant concentration in the source/drain regions 218 may be from about $1\times10^{19}$ atoms/cm$^3$ to about $2\times10^{21}$ atoms/cm$^3$, although lesser or greater dopant concentrations are also contemplated.

In some embodiments, the source/drain regions 218 may be formed by using an ion implantation. For example, n-type dopants, such as phosphorous, or p-type dopants, such as boron, are implanted into the portions of the active region 202A which are not covered by the sacrificial gate structures 210. In some embodiments, the source/drain regions 218 may be formed by etching the active region 202A to form source/drain recesses using the sacrificial gate structures 210 as an etch mask and then growing the source/drain regions 218 in the source/drain recesses by a selective epitaxial growing process. During the selective epitaxial growth, the deposited semiconductor material grows only on exposed semiconductor surfaces, such as surfaces of source/drain recesses, but does not grow on dielectric surfaces, such as surfaces of the isolation structures 204 and the gate spacers 216. In some embodiments, the source/drain regions 218 may be formed by molecular beam epitaxy (MBE). In some embodiments, the source/drain regions 218 may be in-situ doped with dopants of appropriate conductivity type, n-type or p-type, during the epitaxial growth processes. In some embodiments, the source/drain regions 218 may be doped (ex-situ) after the epitaxial growth process utilizing, for example, ion implantation.

In some embodiments, the source/drain regions 218 are further exposed to an annealing process to activate the dopants in the source/drain regions 218 after forming the source/drain regions 218. In some embodiments, the dopants in the source/drain regions 218 are activated by a thermal annealing process including a rapid thermal annealing process, a laser annealing process, or a furnace annealing process.

Figure 2C:
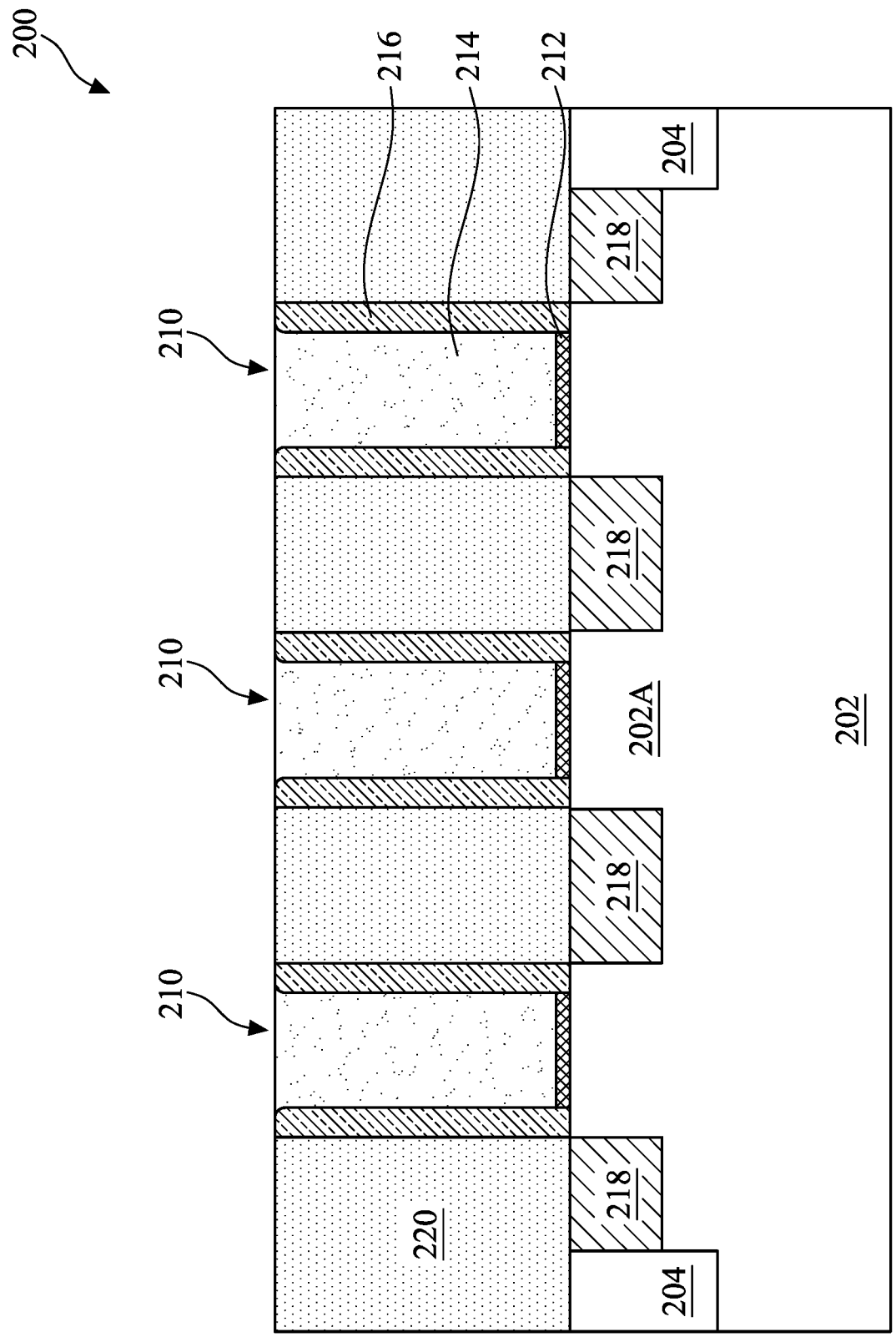

Referring to FIGS. 1 and 2C, the method 100 proceeds to operation 106, in which an interlayer dielectric (ILD) layer 220 is deposited over the isolation structures 204 and the source/drain regions 218, in accordance with some embodiments. FIG. 2C is a cross-sectional view of the semiconductor device 200 of FIG. 2B after depositing the ILD layer 220 over the isolation structures 204 and the source/drain regions 218, in accordance with some embodiments.

Referring to FIG. 2C, the ILD layer 220 is deposited over the isolation structures 204 and the source/drain regions 218 to fill the spaces between the sacrificial gate structures 210. In some embodiments, the ILD layer 220 includes silicon oxide. Alternatively, in some embodiments, the ILD layer 220 includes a low-k dielectric material having a dielectric constant (k) less than silicon oxide. In some embodiments, the low-k dielectric material has a dielectric constant from about 1.2 to about 3.5. In some embodiments, the ILD layer 220 includes silicon oxide made from tetraethylorthosilicate (TEOS) oxide, undoped silicate glass, or doped silicate glass such as borophosphosilicate glass (BPSG), fluorosilica glass (FSG), phosphosilicate glass (PSG), boron doped silicon glass (BSG), and/or other suitable dielectric materials. In some embodiments, the ILD layer 220 is deposited by CVD, PECVD, PVD, or spin coating. In some embodiments, the ILD layer 220 is deposited to have a top surface above the topmost surfaces of the sacrificial gate structures 210 (e.g., the top surfaces of the sacrificial gate conductors 214). The ILD layer 220 is subsequently planarized, for example, by CMP. After the planarization, the ILD layer 220 has a surface coplanar with the topmost surfaces of the sacrificial gate structures 210.

Figure 2D:
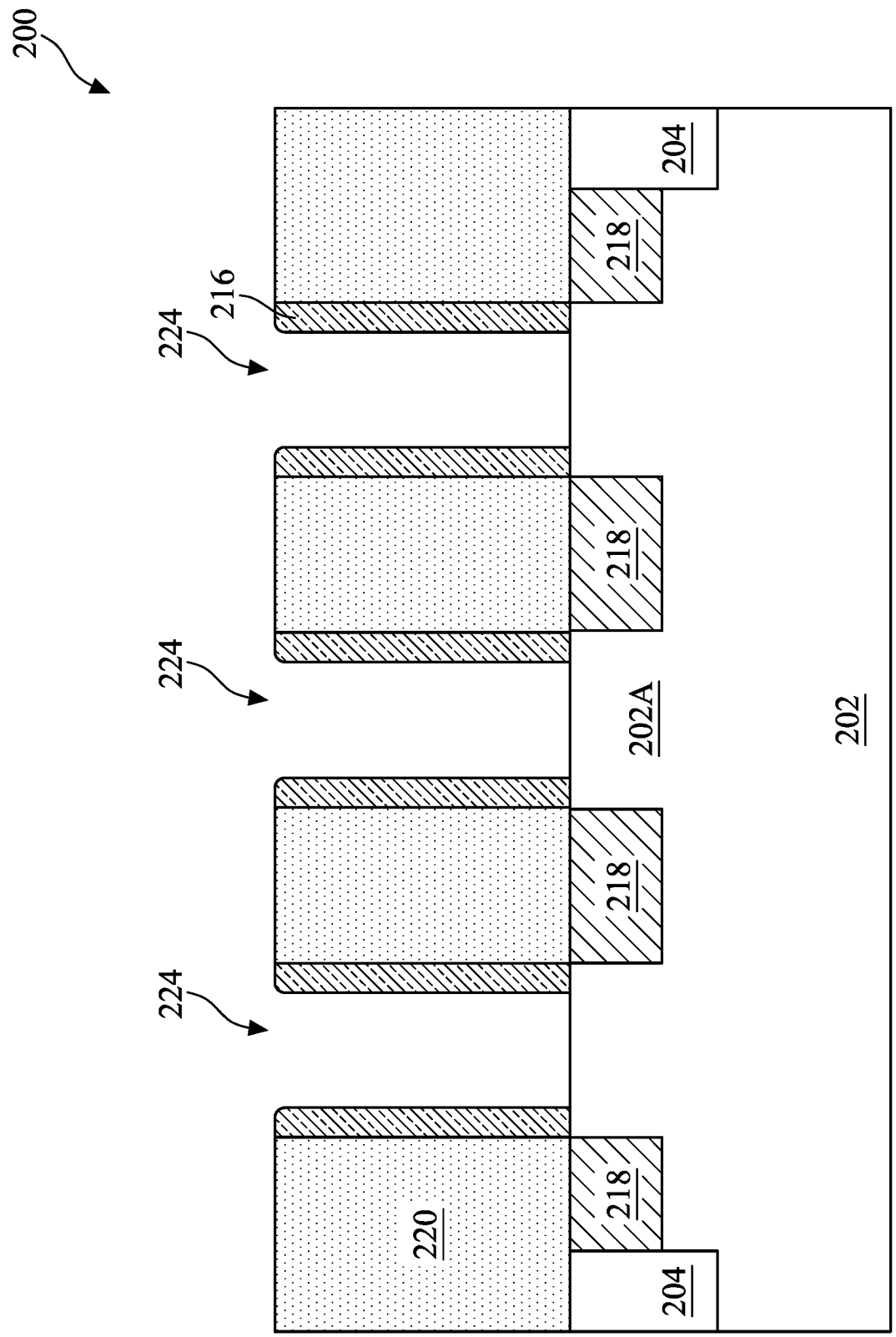

Referring to FIGS. 1 and 2D, the method 100 proceeds to operation 108, in which the sacrificial gate stacks (212, 214) are removed to form gate cavities 224, in accordance with some embodiments. FIG. 2D is a cross-sectional view of the semiconductor device 200 of FIG. 2C after removing the sacrificial gate stacks (212, 214) to form the gate cavities 224, in accordance with some embodiments.

Various components of the sacrificial gate stacks (212, 214) such as sacrificial gate dielectrics 212 and sacrificial gate conductors 214 are removed selectively to the semiconductor material that provide the active region 202A and the dielectric materials that provide the gate spacers 216 and the ILD layer 220 by at least one etch. In some embodiments, the at least one etch is a dry etch such as RIE, a wet etch such as an ammonia etch, or a combination thereof. Each gate cavity 224 occupies a volume from which the corresponding sacrificial gate stack (212, 214) is removed and is laterally confined by inner sidewalls of the corresponding gate spacers 216. After removal of the sacrificial gate stacks (212, 214), the channel regions in the active region 202A are physically exposed by the gate cavities 224.

Figure 2E:
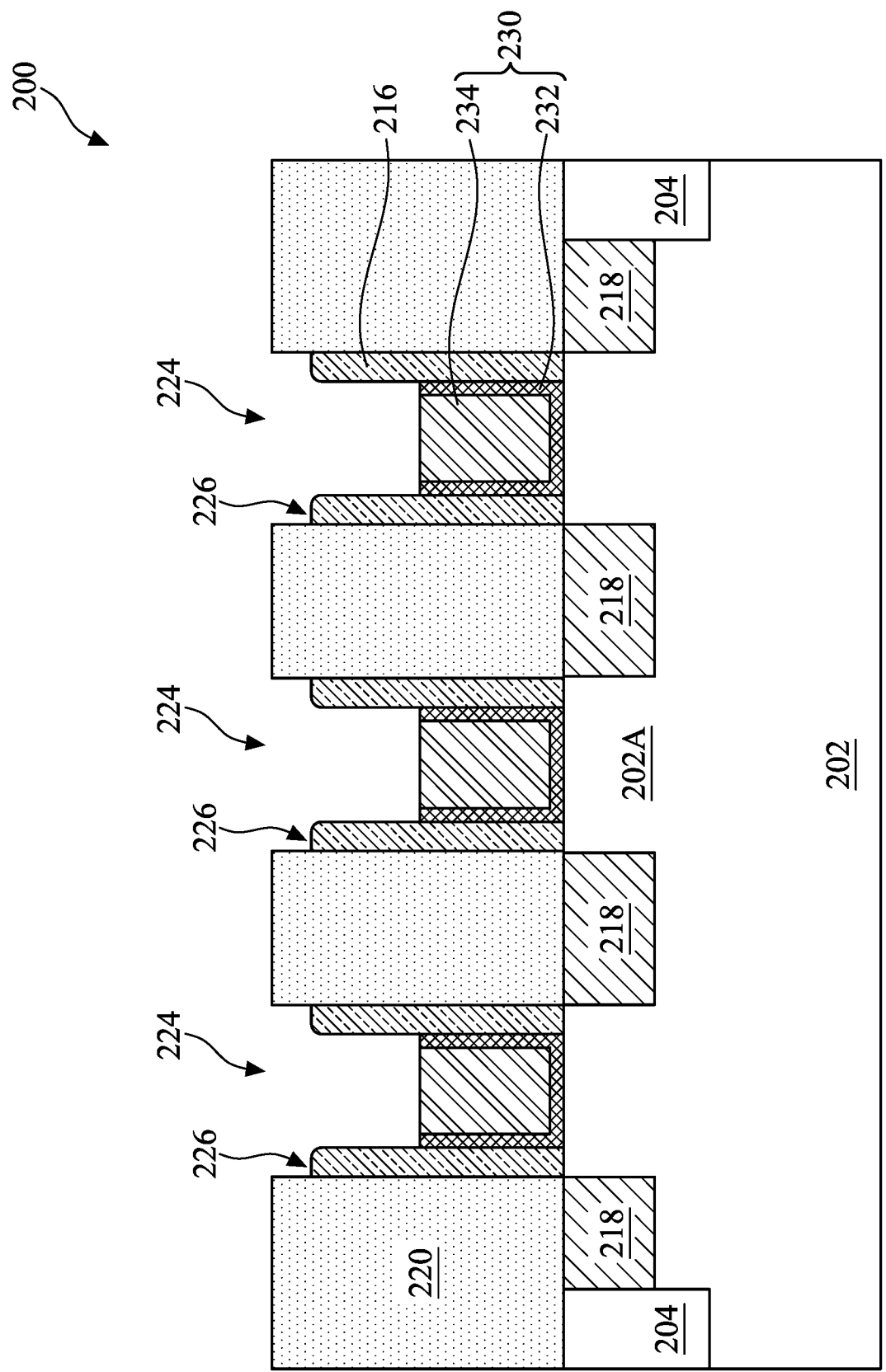

Referring to FIGS. 1 and 2E, the method 100 proceeds to operation 110, in which the gate stacks 230 are formed in the gate cavities 224, in accordance with some embodiments. FIG. 2E is a cross-sectional view of the semiconductor device 200 of FIG. 2D after forming the gate stack 230 in the gate cavities 224, in accordance with some embodiments.

Each gate stack 230 includes a gate dielectric 232 along sidewalls and a bottom surface of a corresponding gate cavity 224 and a gate electrode 234 surrounded by the gate dielectric 232. In some embodiments, the gate stacks 230 can be referred to as metal gate stacks.

In some embodiments, the gate stacks 230 may be formed by first depositing a gate dielectric layer (not shown) along sidewalls and bottom surfaces of the gate cavities 224 and on the top surfaces of the ILD layer 220 and gate spacers 216. In some embodiments, the gate dielectric layer includes a high-k dielectric material having a dielectric constant greater than silicon oxide. Exemplary high-k dielectric materials include, but are not limited to, silicon nitride (SiN), hafnium oxide (HfO), zirconium oxide (ZrO), lanthanum oxide (LaO), aluminum oxide (AlO), titanium oxide (TiO), strontium titanium oxide (SrTiO), lanthanum Aluminum oxide (LaAlO), yttrium oxide (YO), and combinations thereof. In some embodiments, the gate dielectric layer is deposited using a conformal deposition process including, for example, CVD or ALD.

In some embodiments, prior to depositing the high-k dielectric layer, an interfacial dielectric (not shown) is formed on the bottom surfaces of gate cavities 224. In some embodiments, the interfacial dielectric includes a dielectric oxide such as silicon oxide. In some embodiments, the interfacial dielectric is formed by thermal or chemical oxidization of surface portions of the active region 202A that are exposed by the gate cavities 224. In some embodiments, the chemical oxidation involves using a chemical oxidant such as ozone, hydrogen peroxide, or the like. In some other embodiments, the interfacial dielectric is formed by ALD, CVD or other suitable methods. The interfacial dielectric is optional and can be omitted in some embodiments.

A gate electrode layer (not shown) is then deposited on the gate dielectric layer to fill the remaining volume of each of the gate cavities 224. In some embodiments, the gate electrode layer includes a conductive metal such as, for example, tungsten (W), copper (Cu), cobalt (Co), titanium (Ti), tantalum (Ta), molybdenum (Mo), ruthenium (Ru), platinum (Pt), iridium (Ir), a silicide thereof such as $ZrSi_2$, TaSi, MoSi, NiSi, or PtSi, a nitride thereof such as HfN, TiN, TaN or MoN, or an alloy thereof. In some embodiments, the gate electrode layer is deposited by CVD, PVD, plating, and/or other suitable processes.

Excess portions of the gate electrode layer and the high-k dielectric layer outside the gate cavities 224 are subsequently removed by a planarization process such as, for example, CMP. The remaining portions of the gate electrode layer and the remaining portions of the gate dielectric layer within the gate cavities 224 may then be recessed utilizing a dry etch or a wet etch. The recessed portions of the gate electrode layer within the gate cavities 224 constitute the gate electrodes 234, and the recessed portions of the gate dielectric layer constitute the gate dielectrics 232. The top surfaces of the gate dielectrics 232 and the gate electrodes 234 are below the top surface of the ILD layer 220 and the top surfaces of the gate spacers 216.

In some embodiments, another etch back process is performed that recesses the gate spacers 216 to form recesses 226 above the gate spacers 216. As shown in FIG. 2E, the top surfaces of the gate spacers 216 after etching are located below the top surface of the ILD layer 220. In some embodiments, the top surfaces of the gate spacers 216 are about 1 nm to about 30 nm below the top surface of the ILD layer 220. The etch back process for recessing the gate spacers 216 is optional. Accordingly, in some embodiments, the top surfaces of the gate spacers 216 remain coplanar with the top surface of the ILD layer 220 after formation of the gate stacks 230.

Figure 2F:
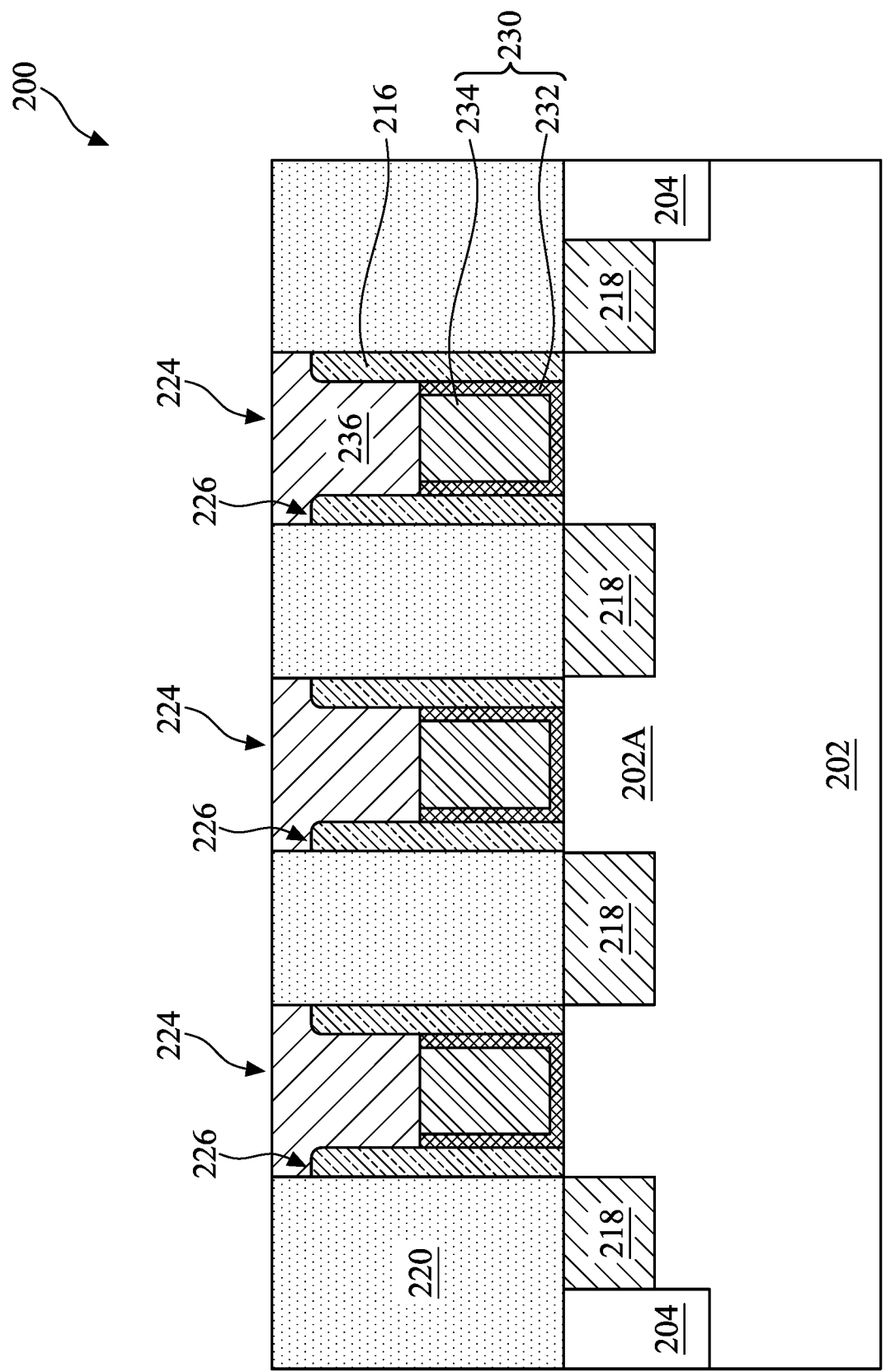

Referring to FIGS. 1 and 2F, the method 100 proceeds to operation 112, in which gate caps 236 are formed above the gate stacks 230 and the gate spacers 216, in accordance with some embodiments. FIG. 2F is a cross-sectional view of the semiconductor device 200 of FIG. 2E after forming the gate caps 236 above the gate stacks 230 and the gate spacers 216, in accordance with some embodiments.

The gate caps 236 serve to protect the underlying gate stacks 230 in subsequent processes. In some embodiments, the gate caps 236 may be formed by depositing a gate cap material layer over the ILD layer 220, the gate spacers 216, and the gate stacks 230. The gate cap material layer fills the gate cavities 224 and the voids 226. In some embodiments, the gate cap material layer may include a dielectric material such as, for example, SiN, ZrSi, SiCN, ZrAlO, TiO, TaO, ZrO, LaO, ZrN, SiC, ZnO, SiOC, HfO, LaO, AlO, SiOCN, AlON, YO, TaCN, or SiO. In some embodiments, the gate cap material layer is made of a material different from that of the ILD layer 220, and thus provides a better etching selectivity than the ILD layer 220. In some embodiments, the gate cap material layer may be deposited utilizing a deposition process such as, for example, PVD, CVD, PECVD, or low pressure CVD.

Following the deposition of the gate cap material layer, a planarization process such as CMP is performed such that the gate cap material layer is lowered to level with the ILD layer 220. After the planarization process, the top surfaces of the gate caps 236 are coplanar with the top surface of the ILD layer 220.

In instances where the top surfaces of the gate spacers 216 are located below the top surface of the ILD layer 220, as shown in FIG. 2F, each of the gate caps 236 include a lower portion laterally surrounded by the gate spacers 216 and an upper portion laterally surrounded by the ILD layers 220. In some embodiments, the lower portion of the gate cap 236 has a thickness ranging from about 1 nm to about 30 nm, and the upper portion of the gate cap 236, which has a greater width than that of the lower portion, has a thickness ranging from about 1 nm to about 30 nm. In instances where the top surfaces of the gate spacers 216 are coplanar with the top surface of the ILD layer 220, the gate cap 236 has a uniform width throughout its thickness.

Figure 2G:
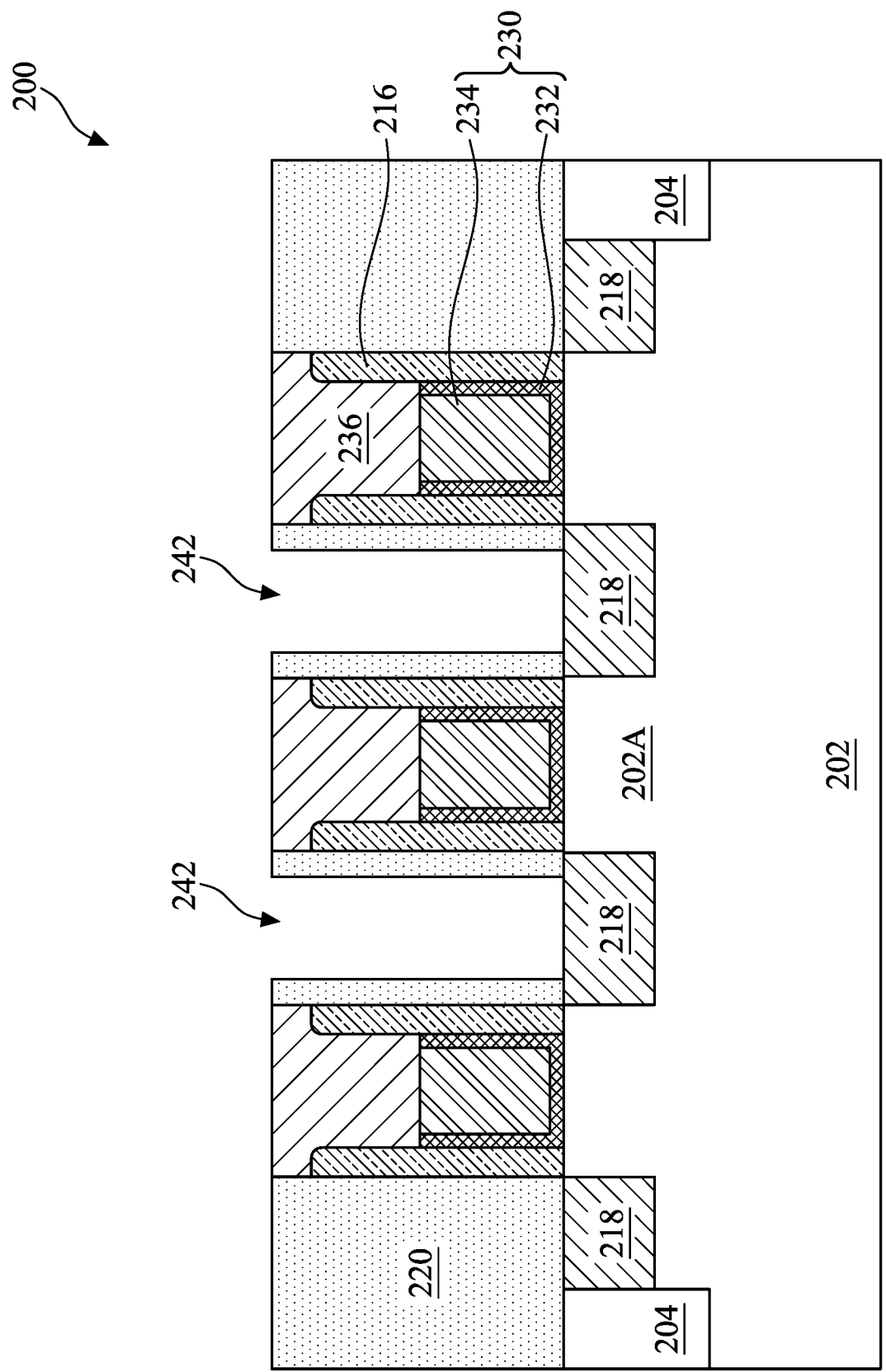

Referring to FIGS. 1 and 2G, the method 100 proceeds to operation 114, in which source/drain contact openings 242 are formed above the source/drain regions 218, in accordance with some embodiments. FIG. 2G is a cross-sectional view of the semiconductor device 200 of FIG. 2F after forming the source/drain contact openings 242 above the source/drain regions 218, in accordance with some embodiments.

The source/drain contact openings 242 extend through the ILD layer 220 to expose portions of the source/drain regions 218. In some embodiments, the source/drain contact openings 242 are formed by removing the ILD layer 220 using an etching process. For example, the formation of the source/ drain contact openings 242 includes applying a photoresist layer (not shown) over the ILD layer 220 and the gate caps 236 by a suitable deposition process, such as spin-on coating, patterning the photoresist layer to form a patterned photoresist layer by a lithography method, and etching the ILD layer 220 to remove portions of the ILD layer 220 that are exposed by the patterned photoresist layer. In some embodiments, the ILD layer 220 is etched using a dry etch such as, for example, RIE or plasma etch. In some embodiments, the ILD layer 220 is etched using a wet etch. The gate caps 236 are protected by the patterned photoresist layer and remain intact during the ILD layer 220 etching.

After formation of the source/drain contact openings 242 in the ILD layer 220, the patterned photoresist layer is removed, for example, by ashing. Alternatively, in some embodiments, a hard mask is used such that the source/drain contact opening pattern is transferred from the pattered photoresist layer to the hard mask by a first etch and then transferred to the ILD layer 220 by a second etch.

Figure 2H:
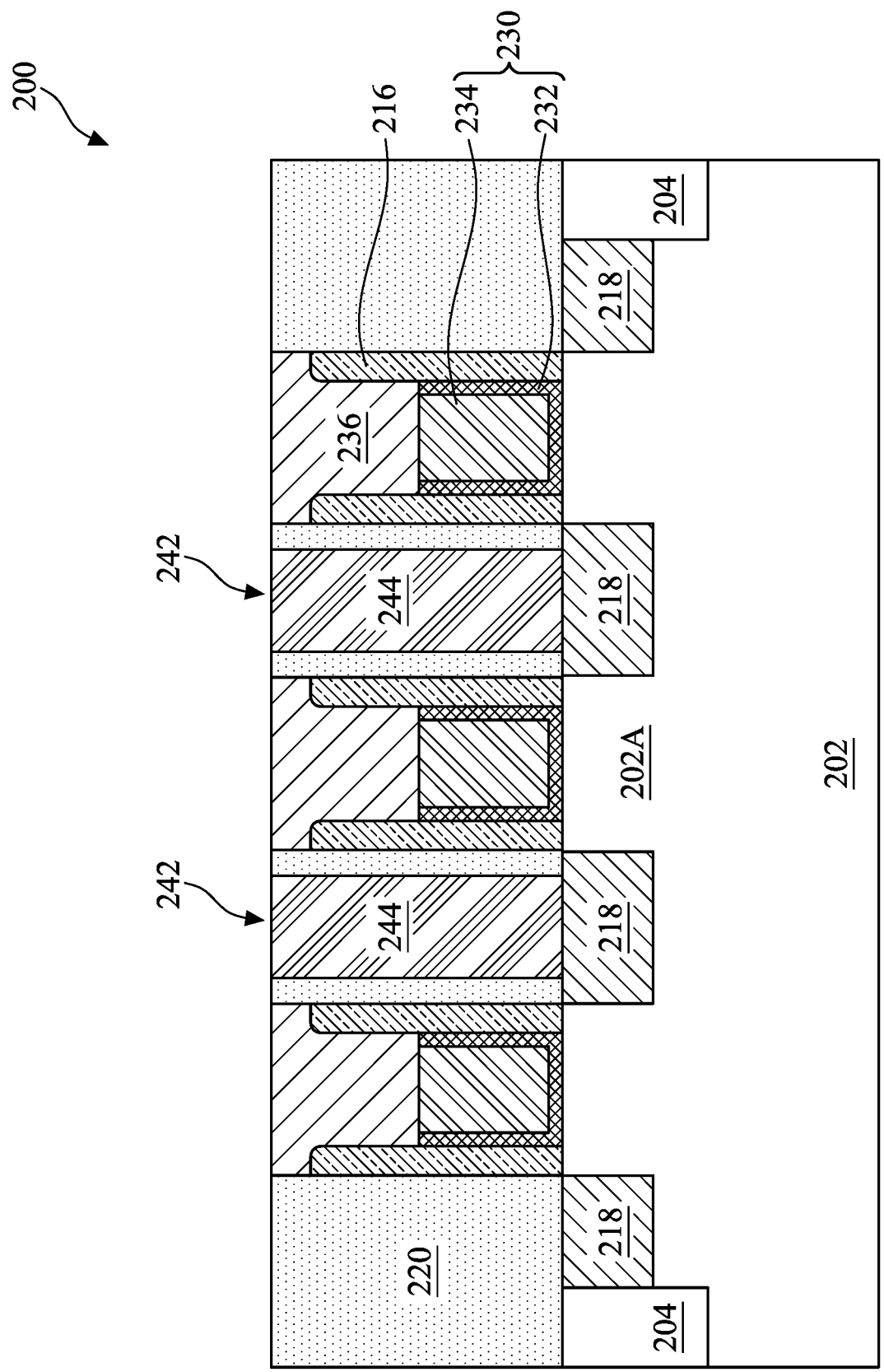

Referring to FIGS. 1 and 2H, the method 100 proceeds to operation 116, in which source/drain contact structures 244 are formed in the source/drain contact openings 242, in accordance with some embodiments. FIG. 2H is a cross-sectional view of the semiconductor device 200 of FIG. 2G after forming the source/drain contact structures 244 in the source/drain contact openings 242, in accordance with some embodiments.

The source/drain contact structures 244 extend within the source/drain contact openings 242 and are in contact with the source/drain regions 218. The source/drain contact structures 244 may include one or more layers of conductive metal, such as elemental metals, metal nitrides, or combinations thereof. In some embodiments, the source/drain contact structures 244 include tungsten (W), ruthenium (Ru), cobalt (Co), titanium (Ti), titanium nitride (TN), molybdenum (Mo), copper (Cu), tantalum (Ta) and/or other suitable materials. In some embodiments, the formation of the source/drain contact structures 244 includes depositing a conductive metal in the source/drain contact openings 242 by, for example, CVD, PVD, plating, and/or other suitable deposition processes. The conductive material that is deposited outside the source/drain contact opening 242 is then removed by a planarization process such as, for example, CMP, so that the top surfaces of the source/drain contact structures 244 are coplanar with the top surface of the ILD layer 220.

In some embodiments, prior to depositing the conductive material, a diffusion barrier layer (not shown) is depositing along the sidewalls and the bottom surfaces of the source/drain contact openings 242 to prevent out-diffusion of the conductive metal and/or improve metal adhesion. In some embodiments, the diffusion barrier layer may include TiN, tantalum nitride (TaN), tungsten nitride (WN), titanium silicon nitride (TiSiN), or tantalum silicon nitride (TaSiN).

Figure 2I:
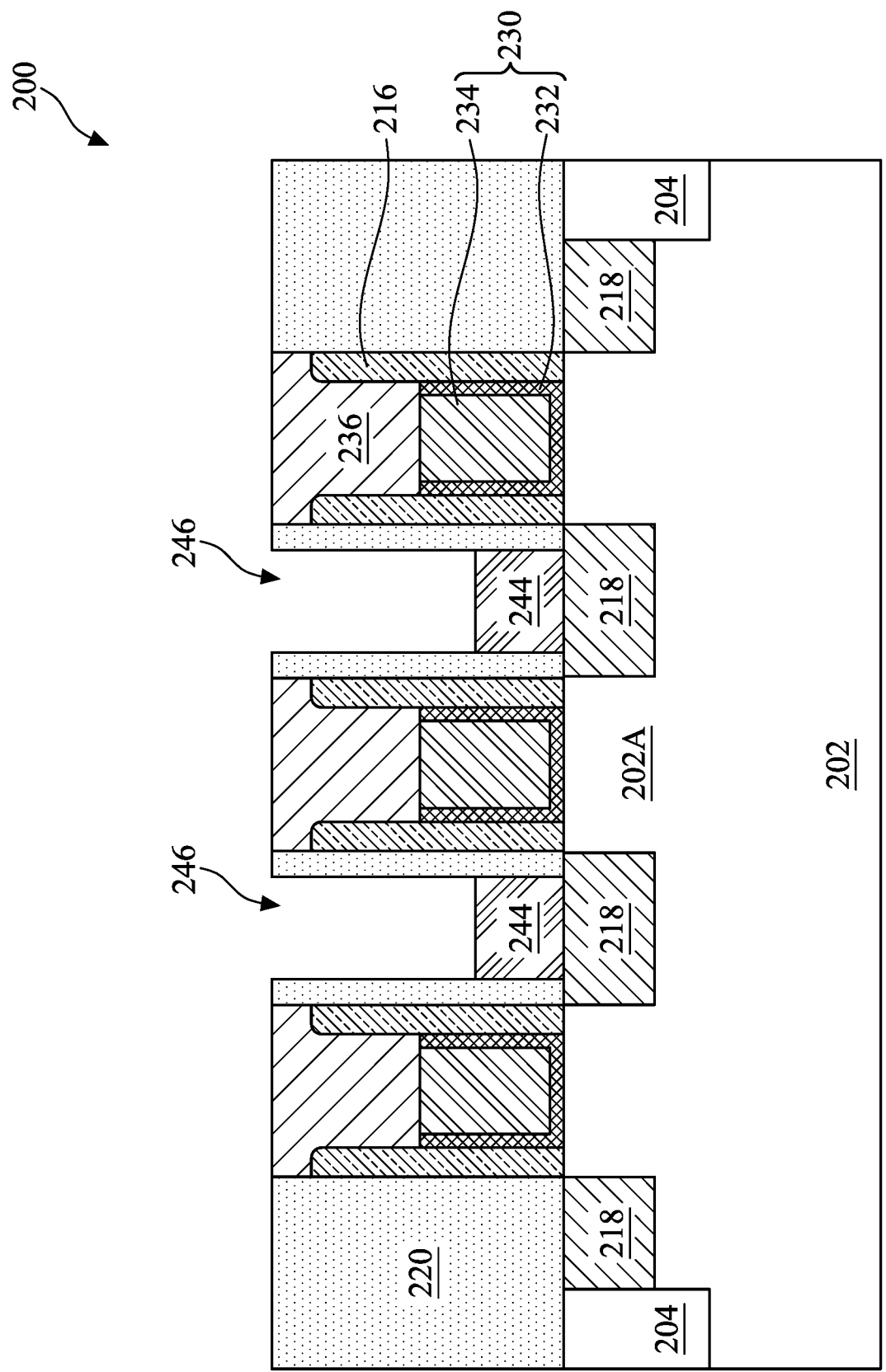

Referring to FIGS. 1 and 2I, is a cross-sectional view of the semiconductor device 200 of FIG. 2H after recessing the source/drain contact structures 244 to form the openings 246 above the source/drain contact structures 244, in accordance with some embodiments.

In some embodiments, the source/drain contact structures 244 are recessed by an etch back process, which selectively etches the source/drain contact structures 244 without substantially etching the ILD layer 220 and the gate caps 236. As a result of etching, the top surfaces of the source/drain contact structures 244 are below the top surface of the ILD layer 220 so as to form openings 246 above the respective source/drain contact structures 244. In some embodiments, the top surfaces of the source/drain contact structures 244 are about 1 nm to 40 nm below the top surface of the ILD layer 220. In some embodiments, the top surfaces of source/drain contact structures 244 are below the top surfaces of the gate electrodes 234. Thus, after recessing, the top surfaces of the source/drain contact structures 244 are proximal to the source/drain regions 218.

Figure 2J:
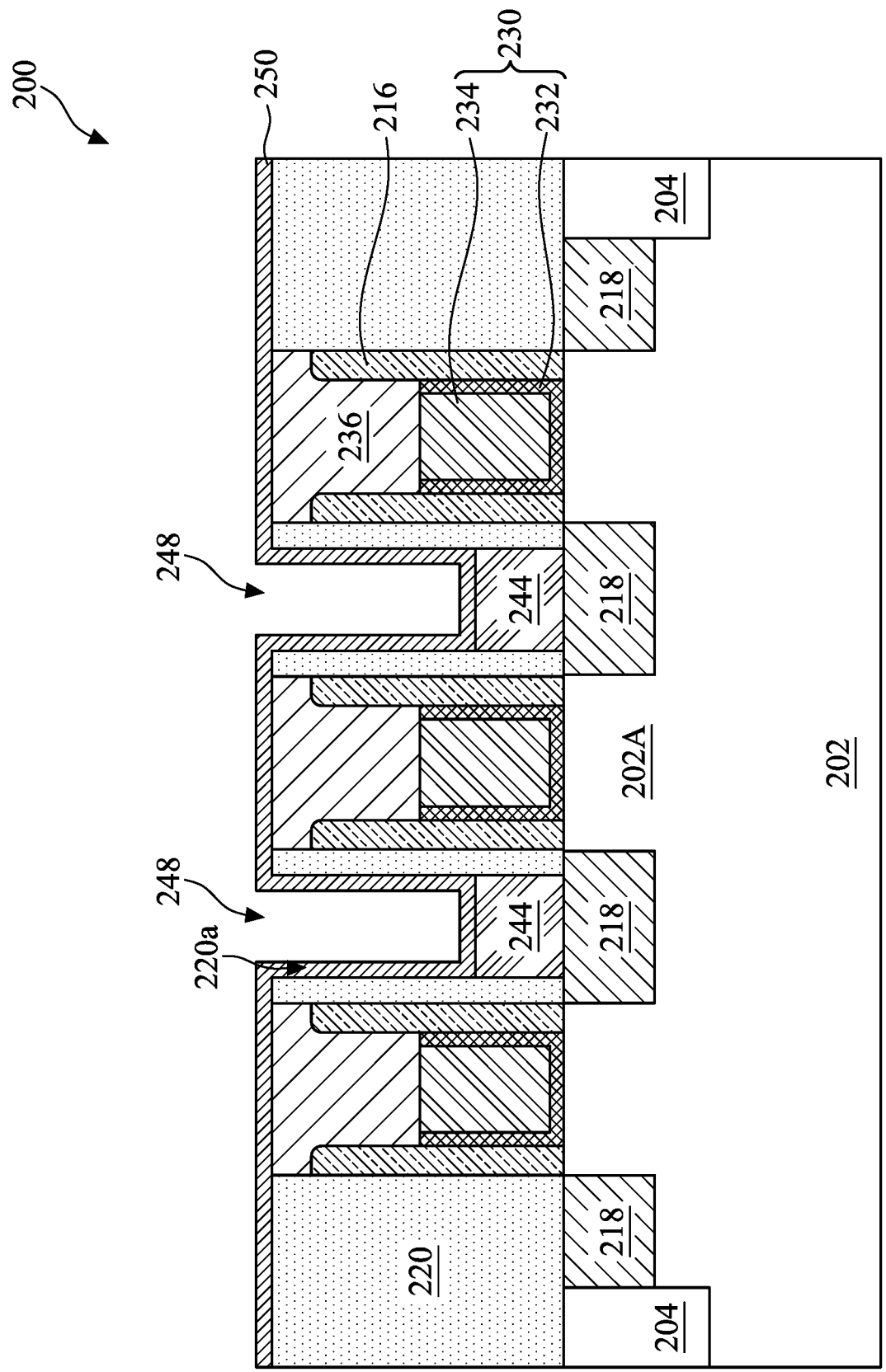

Referring to FIGS. 1 and 2J, the method 100 proceeds to operation 120, in which a dielectric layer 250 is deposited in the openings 246, in accordance with some embodiments. FIG. 2J is a cross-sectional view of the semiconductor device 200 of FIG. 2I after depositing the dielectric layer 250 in the openings 246, in accordance with some embodiments.

The dielectric layer 250 is conformally deposited along sidewalls and bottom surfaces of the openings 246 and over the top surfaces of the ILD layer 220 and the gate caps 236. The dielectric layer 250 thus lines the sidewalls 220a of the ILD layer 220 and the top surfaces of the source/drain contact structures 244. In some embodiments, the dielectric layer 250 may include a dielectric material such as, for example, SiO, SiN, SiC, SiCN, SiOC, SiOCN, ZrSi, ZrAlO, TiO, TaO, ZrO, LaO, ZrN, ZnO, HfO, LaO, AlO, AlON, YO, TaCN, or combinations thereof. In some embodiments, the dielectric layer 250 may be formed by a conformal deposition process such as, for example, CVD or ALD.

Figure 2K:
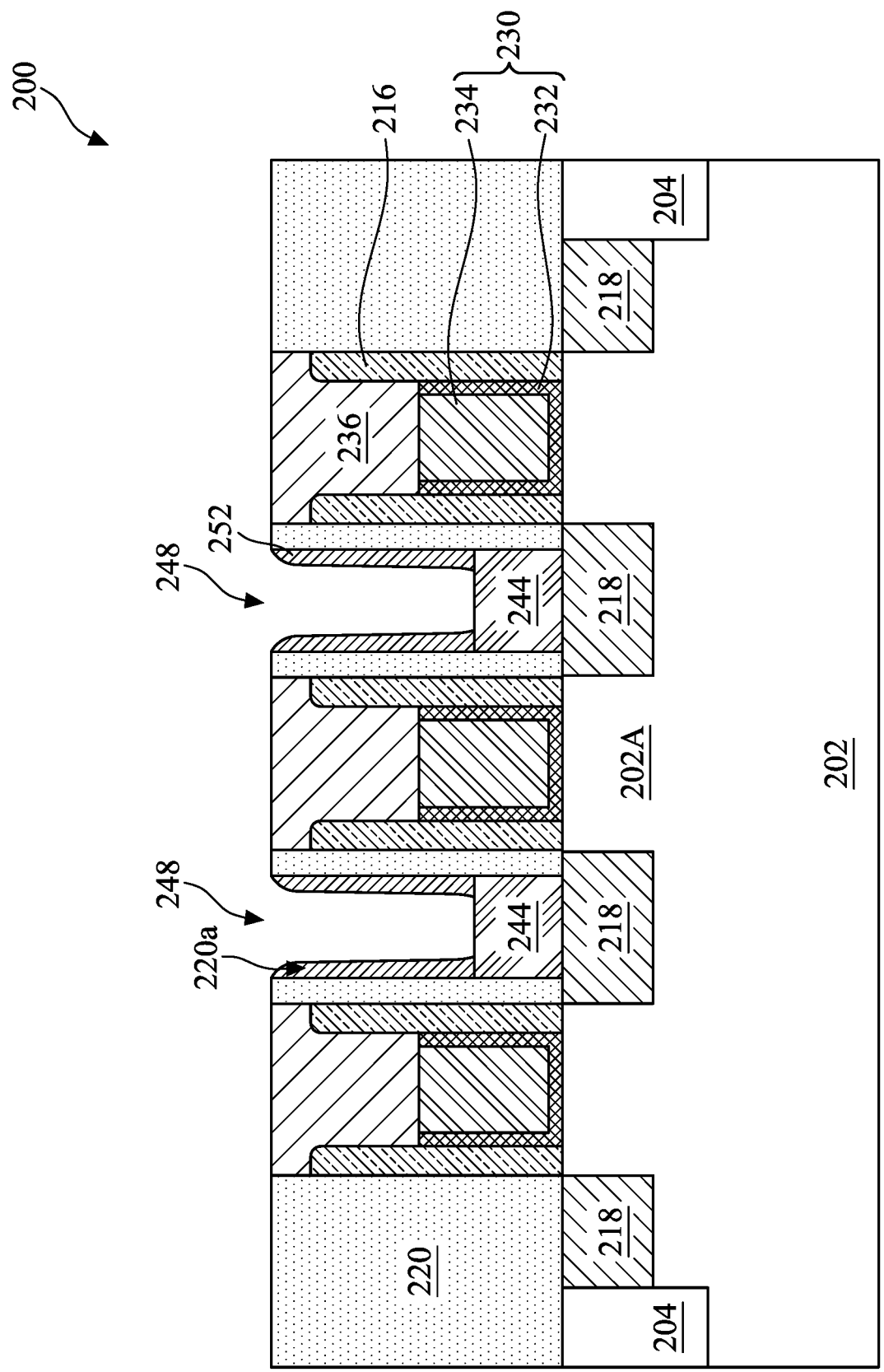

Referring to FIGS. 1 and 2K, the method 100 proceeds to operation 122, in which dielectric liners 252 are formed on the sidewalls of the openings 246, in accordance with some embodiments. FIG. 2K is a cross-sectional view of the semiconductor device 200 of FIG. 2J after forming the dielectric liners 252 on the sidewalls of the openings 246, in accordance with some embodiments.

The horizontal portions of the dielectric layer 250 that are located on the top surfaces of the source/drain contact structures 244, the ILD layer 220, and the gate caps 236 are removed by an anisotropic etch. The anisotropic etch may include a dry etch such as RIE or plasma etch, a wet etch, or a combination thereof. After etching, the vertical portions of the dielectric layer 250 remaining on the sidewalls of the openings 246 constitute the dielectric liners 252. The dielectric liners 252 and the source/drain contact structures 244 define contact openings 248 that expose top surfaces of respective source/drain contact structures 244. In some embodiments, the dielectric liners 252 contact the sidewalls 220a of the ILD layer 220.

In some embodiments, the etching process also etches vertical portions of dielectric layer 250 to form dielectric liners 252 with a tapered profile with rounded top corners. A thickness of the resulting dielectric liners 252 at the top of the contact openings 248 is reduced to a greater extent relative to a thickness of the dielectric liners 252 at the bottom of the contact openings 248. In some embodiments, the thickness of the dielectric liners 252 at the top of the contact openings 248 ranges from about 0.1 nm to about 5 nm, while the thickness of the dielectric liners 252 at the bottom of the contact openings 248 ranges from about 1 nm to about 6 nm. The angle of the dielectric liners 252 at the bottom of the contact openings 248 ranges from 70 degrees to 89 degrees. In some embodiments, the etching process completely removes the vertical portions of the dielectric layer 250 from the top of contact openings 248. The sidewalls of the contact openings 248 at the top thus are free of the dielectric liners 252. The top surfaces of the dielectric liners 252 thus are below the top surface of the ILD layer 220.

Figure 2L:
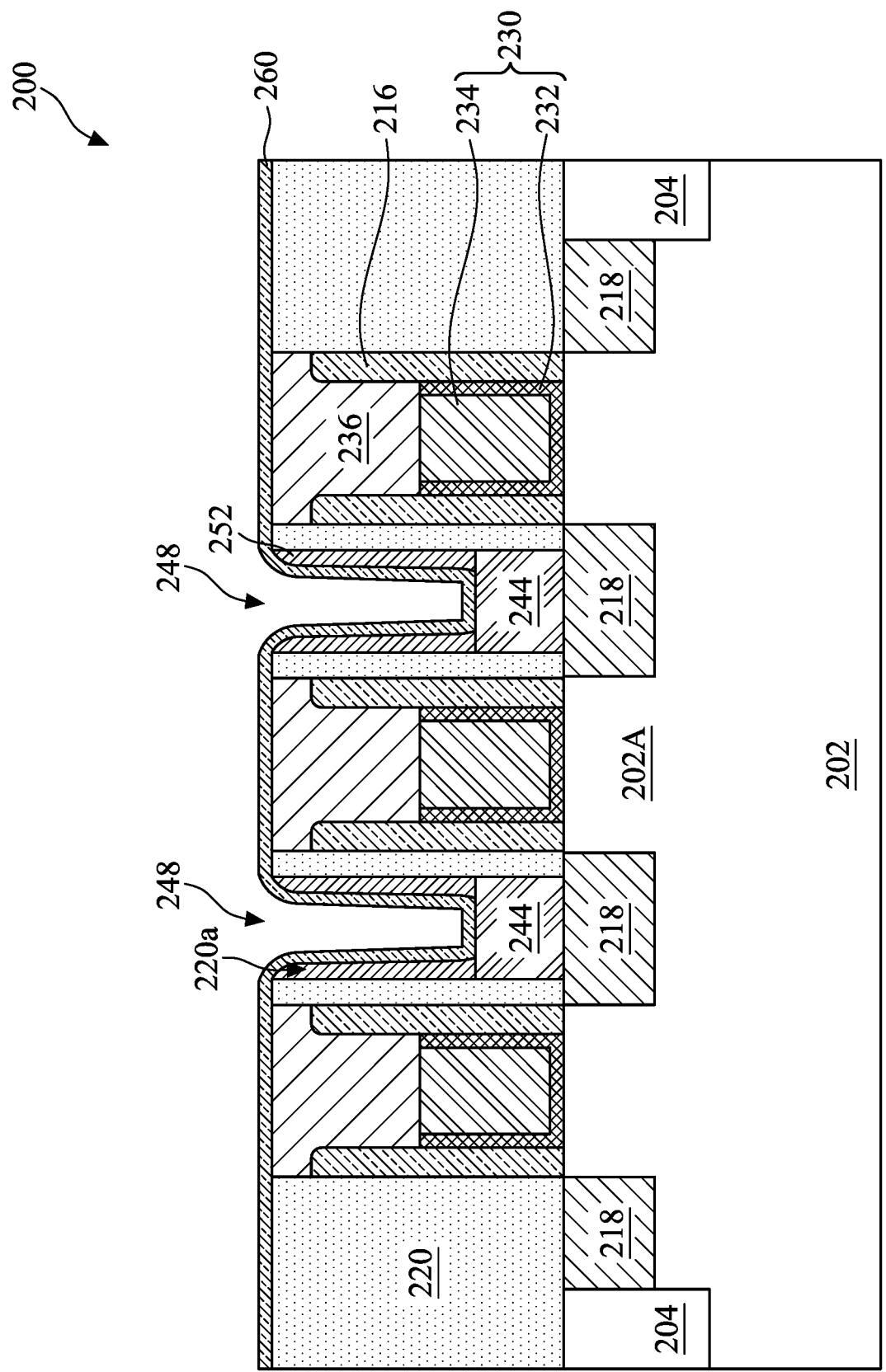

Referring to FIGS. 1 and 2L, the method 100 proceeds to operation 124, in which a glue layer 260 is deposited on the dielectric liners 252 and the source/drain contact structures 244 in the contact openings 248 and on the ILD layer 220 and the gate caps 236 outside of the contact openings 248, in accordance with some embodiments. FIG. 2L is a cross-sectional view of the semiconductor device 200 of FIG. 2K after depositing the glue layer 260 on the dielectric liners 252 and the source/drain contact structures 244 in the contact openings 248 and on the ILD layer 220 and the gate caps 236 outside of the contact openings 248, in accordance with some embodiments.

The glue layer 260 is conformally deposited on the dielectric liners 252 and the source/drain contact structures 244 within the contact openings 248 and on the ILD layer 220 and the gate caps 236 outside of the contact openings 248. The glue layer 260 thus lines the sidewalls of the dielectric liners 252 and the top surfaces of the source/drain contact structures 244. The glue layer 260 may act as a diffusion barrier layer to reduce or prevent diffusion of metals from conductive structures subsequently formed into surrounding device features (e.g., ILD layer 220). The glue layer 260 may also improve adhesion of the subsequently formed conductive structures to the dielectric liners 252. In some embodiments, the glue layer 260 may include a low resistivity material such as, for example, TaN, TiN, Ru, or Co. In some embodiments, the glue layer 260 may be formed by a conformal deposition process such as, for example, CVD or ALD.

Figure 2M:
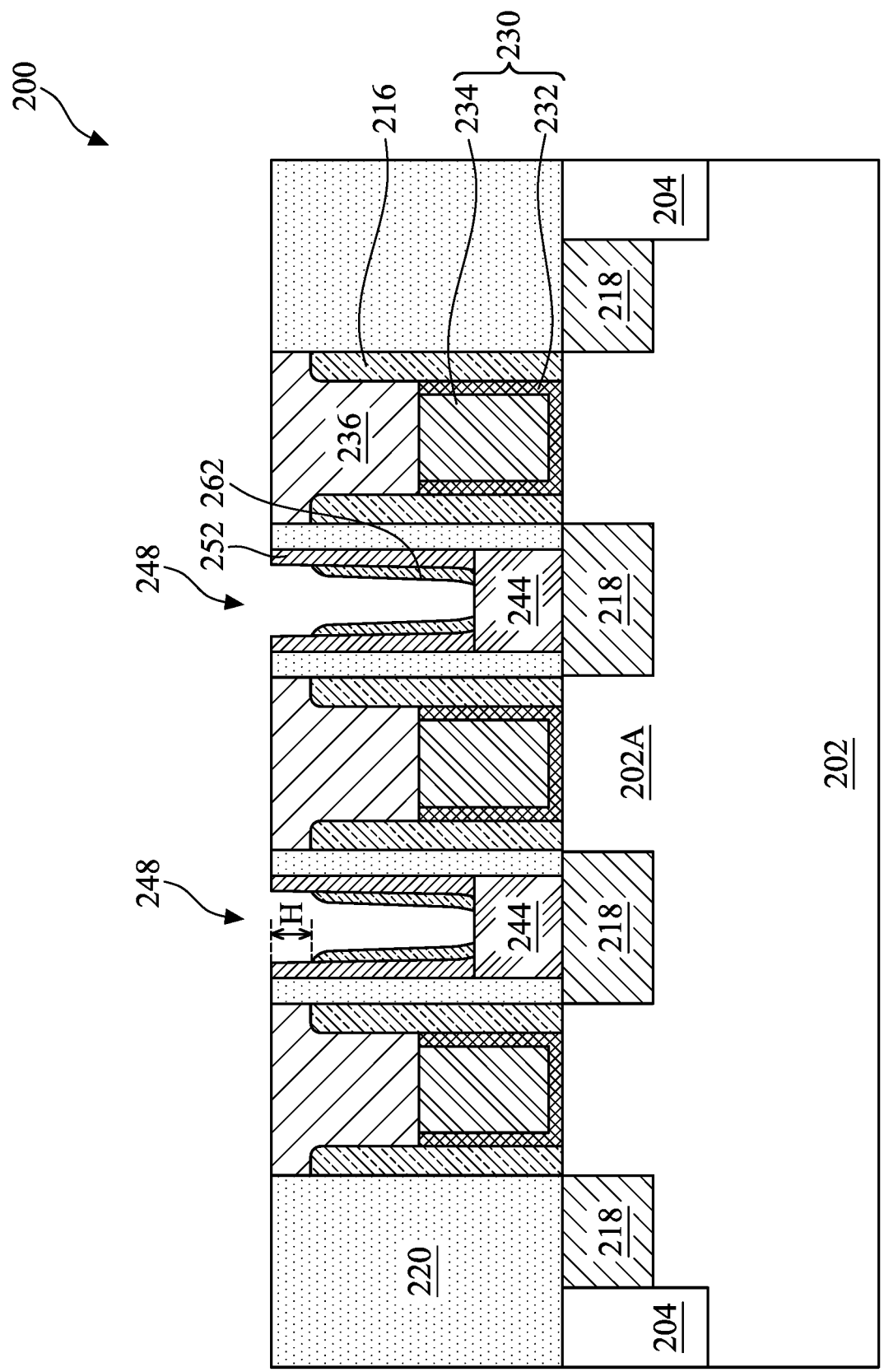

Referring to FIGS. 1 and 2M, the method 100 proceeds to operation 126, in which diffusion barriers 262 are formed on the dielectric liners 252, in accordance with some embodiments. FIG. 2M is a cross-sectional view of the semiconductor device 200 of FIG. 2L after forming the diffusion barriers 262 on the dielectric liners 252, in accordance with some embodiments.

In some embodiments, the diffusion barriers 262 may be formed by recessing the glue layer 260 using an etch back process. The etch back process removes horizontal portions of the glue layer 260 that are located on the top surfaces of the source/drain contact structures 244, the ILD layer 220 and the gate caps 236. In some embodiments, the etch back process may include a dry etch such as RIE or plasma etch, a wet etch, or a combination thereof. After etching, the vertical portions of the glue layer 260 remaining on the dielectric liners 252 constitutes the diffusion barriers 262.

In some embodiments, the etch back process also thins the vertical portions of the glue layer 260 that are located on the dielectric liners 252. As a result, the thickness of the diffusion barriers 262 is reduced and the size of the contact openings 248 is increased. In some embodiments, a thickness of the diffusion barriers 262 at the top of the contact openings 248 is reduced to a greater extent relative to a thickness of the diffusion barriers 262 at the bottom of the contact openings 248, thereby forming tapered diffusion barriers 262 with rounded top corners. In some embodiments, the thickness of the diffusion barriers 262 at the top of the contact openings 248 ranges from about 0.1 nm to about 5 nm, while the thickness of the diffusion barriers 262 at the bottom of the contact openings 248 ranges from about 1 nm to about 6 nm. In some embodiments, the angle of the diffusion barriers 262 at the bottom of the contact openings 248 ranges from 70 degrees to 89 degrees.

In some embodiments, the etching process completely removes the vertical portions of the glue layer 260 from the top of contact openings 248. The sidewalls of the dielectric liners 252 at the top of the contact openings 248 thus are free of the diffusion barriers 262. The top surfaces of the diffusion barriers 262 are located below the top surfaces of the dielectric liners 252. In some embodiments, the height difference (H) between the top surfaces of diffusion barriers 262 and the top surfaces of the dielectric liners 252 ranges from about 1 nm to about 10 nm. That is, the top surfaces of the diffusion barriers 262 are located from about 1 nm to about 10 nm below the top surfaces of the dielectric liners 252.

Figure 2N:
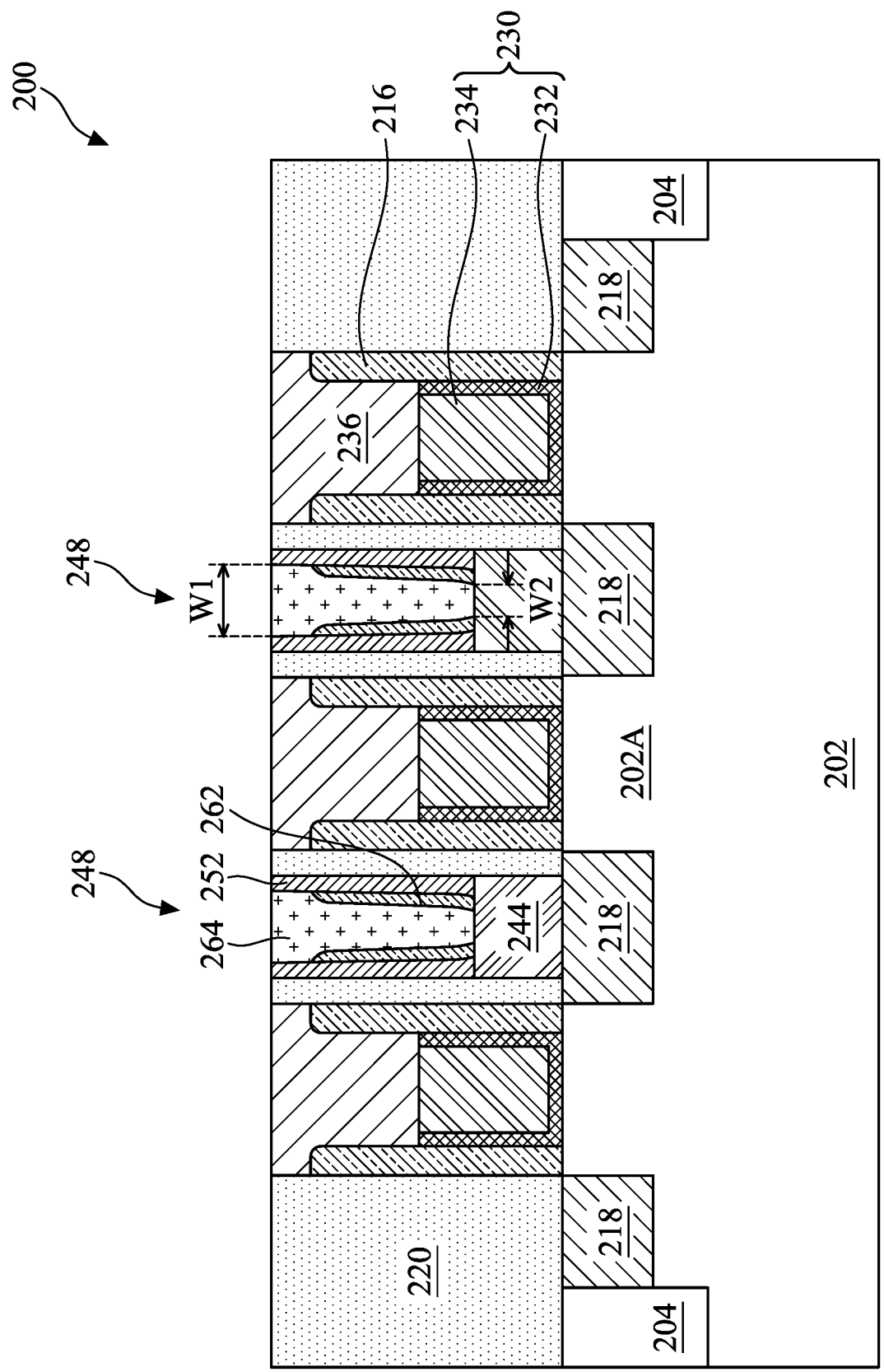

Referring to FIGS. 1 and 2N, the method 100 proceeds to operation 128, in which conductive structures 264 are formed over the source/drain contact structures 244, in accordance with some embodiments. FIG. 2N is a cross-sectional view of the semiconductor device 200 of FIG. 2M after forming conductive structures 264 over the source/drain contact structures 244, in accordance with some embodiments.

The conductive structures 264 extend within contact openings 248 and are in contact with the source/drain contact structures 244. Each of the conductive structures 264 includes a first portion laterally surrounded by the diffusion barriers 262 and a second portion overlying the first portion laterally surrounded by the dielectric liners 252.

In some embodiments, the conductive structures 264 are formed by first depositing a conductive material layer (not shown) to fill remaining volumes of the contact openings 248. The conductive material layer may further overfill contact openings 248 and cover the top surfaces of the ILD layer 220 and the gate caps 236. The conductive material layer may include a material the same as, or different from, the material that provides the source/drain contact structures 244. In some embodiments, the conductive material layer includes W, Ru, Co, Ti, TiN, Mo, Cu, or Ta. The conductive material layer may be deposited using any suitable process such CVD, PVD, or ALD. Since both dielectric liners 252 and the diffusion barriers 262 have rounded top corners, the material accumulation at the corners of the contact openings 248 during the deposition of the conductive material layer is minimized. As a result, the gap fill capacity is enhanced.

Subsequently, a planarization process such as CMP may be performed to remove excess conductive material from the top surfaces of the ILD layer 220 and the gate caps 236. After the planarization process, the top surfaces of the conductive structures 264 are coplanar with the top surface of the ILD layer 220. In some embodiments, the conductive structures 264 have a height ranging from about 1 nm to about 40 nm.

In embodiments of the present disclosure, because each of the contact openings 248 is free of the diffusion barriers 262 at the top, a width (W1) of the conductive structure 264 at the top of each of the contact openings 248 is greater than a width (W2) of the conductive structure 264 at the bottom of each of the contact openings 248. In some embodiments, the width (W1) of the conductive structure 264 at the top of each of the contact openings 248 may range from about 4 nm to about 20 nm, and the width (W2) of the conductive structure 264 at the bottom of each of the contact openings 248 may range from about 6 nm to about 25 nm. Comparing to the conventional conductive structure having a uniform width throughout its entire height, the larger width of the conductive structure 264 at the top of the contact opening 248 can provide a relatively large contact area, which is advantageous for reduction of contact resistance between the conductive structure 264 and a via contact structure subsequently formed thereon.

In embodiments of the present disclosure, because the glue layer 260 is etched to remove the glue layer 260 from the bottom surface of the contact opening 248, no glue layer 260 is present at an interface between the conductive structure 264 and the source/drain contact structure 244. As a result, the contact resistance between the conductive structure 264 and the source/drain contact structure is reduced, which helps to improve the device performance.

Figure 2O:
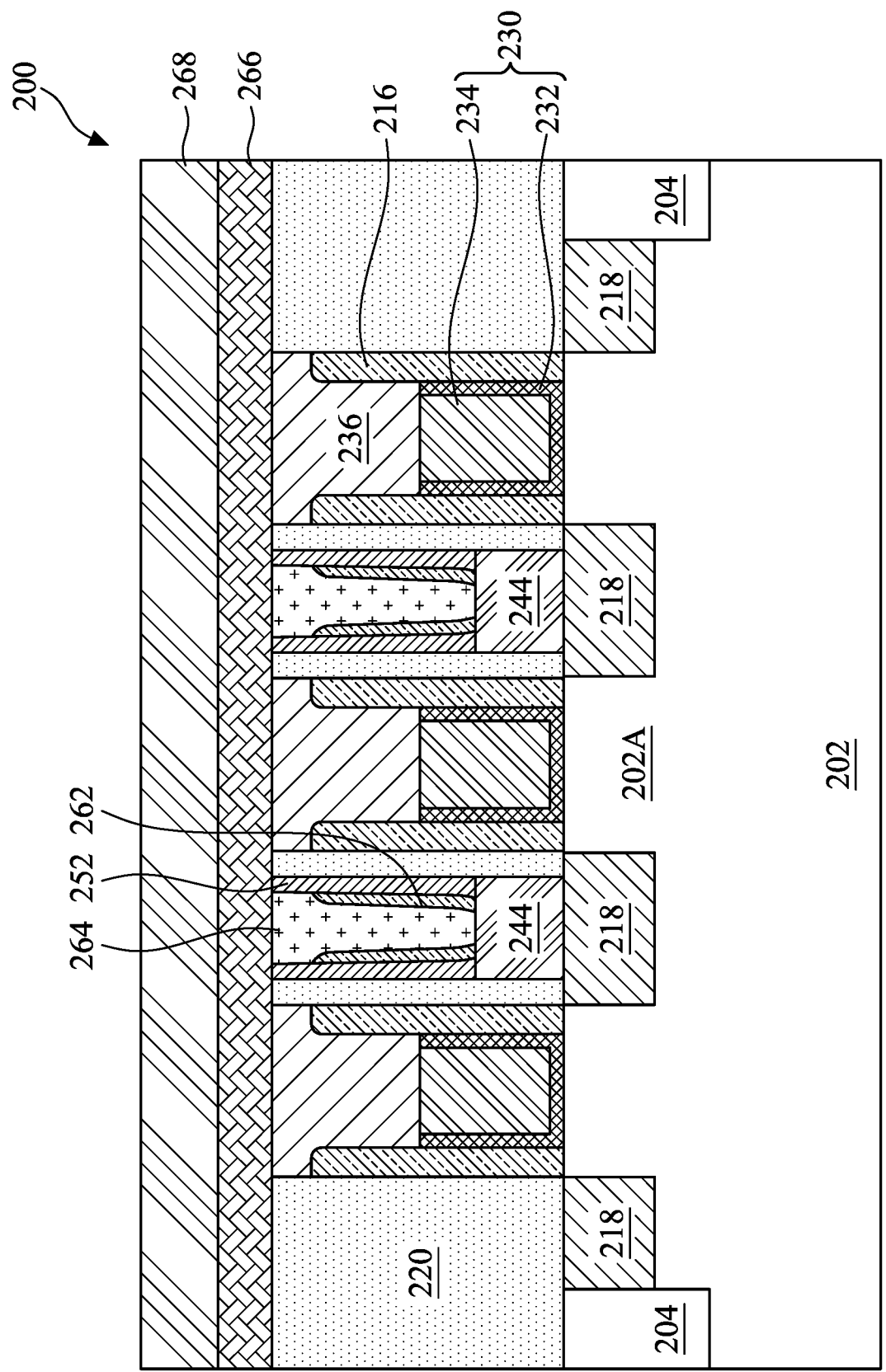
Figure 2P:
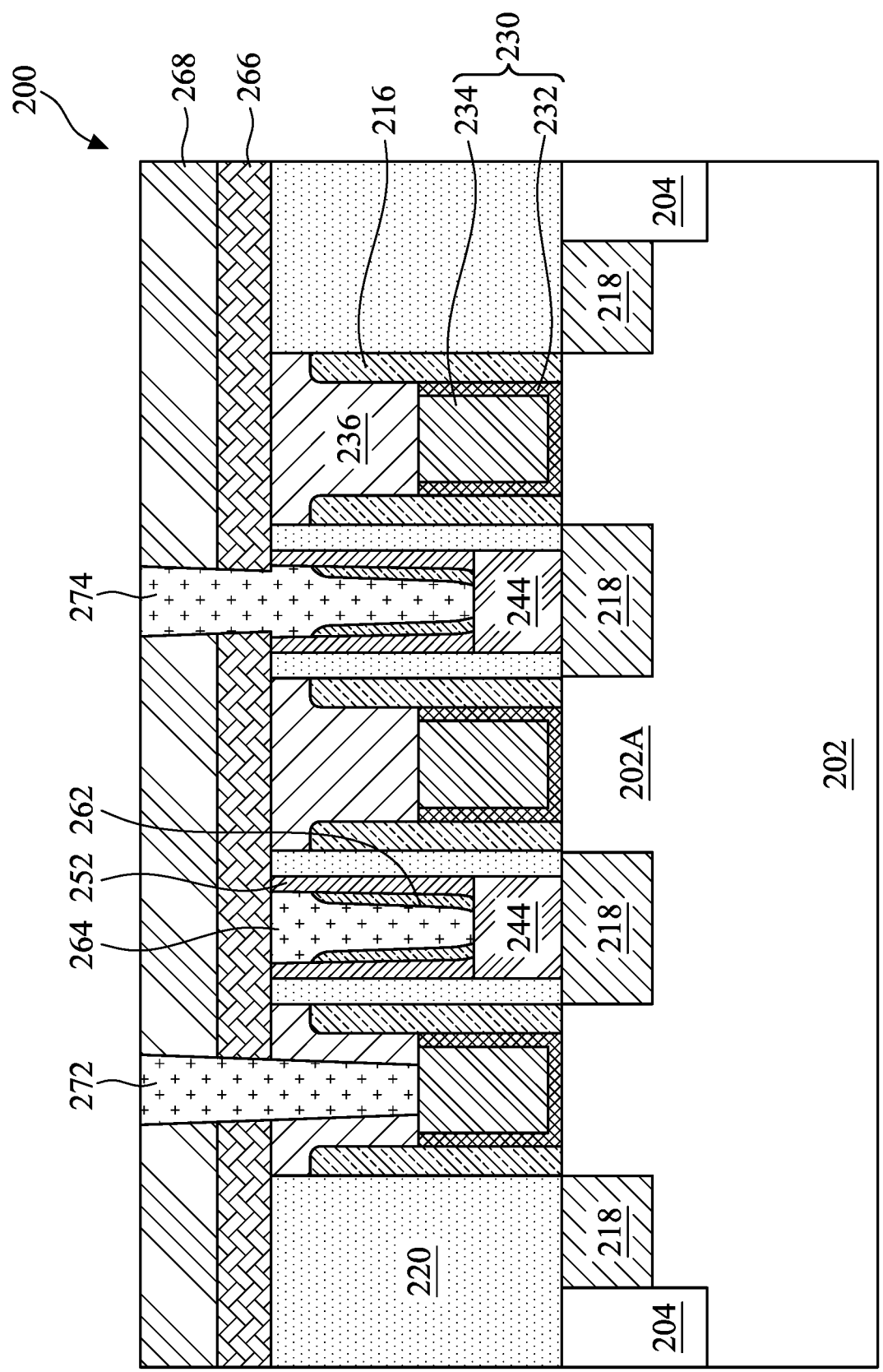

Referring to FIGS. 1 and 2O, the method 100 proceeds to operation 130, in which a contact etch stop layer (CESL) 266 and a contact level dielectric layer 268 are formed, in accordance with some embodiments. FIG. 2O is a cross-sectional view of the semiconductor device 200 of FIG. 2N after forming the CESL 266 and the contact level dielectric layer 268, in accordance with some embodiments.

The CESL 266 is deposited on the ILD layer 220, the gate caps 236, the dielectric liners 252, and the conductive structures 264. In some embodiments, the CESL 266 includes a suitable dielectric material such as, for example SiO, SiN, SiC, SiON, SiOC, SiCN, SiOCN, AlO, AlON, ZrO, ZrN, or combinations thereof, which may be deposited by using, for example, CVD, PVD, PECVD, or the like. In some embodiments, the material of the CESL 266 and the material of the gate caps 236 may be the same. For example, when the gate caps 236 are made of SiN, the CESL 266 is also made of the SiN. In some embodiments, the CESL 266 may have a thickness ranging from about 5 nm to about 50 nm.

The contact level dielectric layer 268 is deposited over the CESL 266. In some embodiments, the contact level dielectric layer 268 includes silicon oxide. Alternatively, in some embodiments, the contact level dielectric layer 268 includes a low-k dielectric material the same as, or different from, the ILD layer 220. In some embodiments, the contact level dielectric layer 268 includes silicon oxide made from TEOS oxide, undoped silicate glass, or doped silicate glass such as borophosphosilicate glass, fluorosilica glass, phosphosilicate glass, boron doped silicon glass, and/or other suitable dielectric materials. In some embodiments, the contact level dielectric layer 268 is deposited by CVD, PECVD, PVD, or spin coating. In some embodiments, the contact level dielectric layer 268 is planarized by a planarization process or otherwise recessed to provide a planar top surface. In some embodiments, the surface of the contact level dielectric layer 268 is planarized using a CMP process.

Referring to FIGS. 1 and 2P, the method 100 proceeds to operation 132, in which a plurality of via contact structures 272, 274 are formed, in accordance with some embodiments. FIG. 2P is a cross-sectional view of the semiconductor device 200 of FIG. 2O after forming the plurality of via contact structures 272, 274, in accordance with some embodiments.

The via contact structures 272, 274 include a first via contact structure 272 formed within the contact level dielectric layer 268, the CESL 266, and the gate cap 236 and in contact with the gate electrode 234, and a second via contact structure 274 formed within the contact level dielectric layer 268 and the CESL 266 and in contact with the conductive structure 264.

To form the via contact structures 272, 274, at least one anisotropic etching process is performed to form a first via opening (not shown) extending through the contact level dielectric layer 268, the CESL 266, and the gate cap 236 to expose a portion of the gate electrode 234 and form a second via opening (not shown) extending through the contact level dielectric layer 268 and the CESL 266 to expose a portion of the conductive structure 264. The at least one anisotropic etching process may include a dry etch such as RIE or plasma etch, a wet etch, or a combination thereof.

Subsequently, a conductive material layer is deposited over the contact level dielectric layer and in the via contact openings. The conductive material layer may include a material the same as, or different from, the material providing the source/drain contact structures 244 and the material providing the contact structures 272, 274. In some embodiments, the conductive material layer may include W, Ru, Co, Ti, TiN, Mo, Cu, or Ta. The conductive material layer may be formed, for example, by CVD, PVD, or ALD. The deposition process is continued until the conductive material layer fills the via contact openings and extends above the contact level dielectric layer 268. The excess portion of the conductive material layer outside of the contact via openings is removed using, for example, CMP, thereby forming the via contact structures 272, 274. In some embodiments, when Cu or a Cu alloy is employed in the first metal layer, an optional plating seed layer (not shown) is formed on the second liner layer prior to the formation of the second metal layer. In some embodiments, the optional plating seed layer is formed by a deposition process including, for example, CVD, PECVD, ALD, and PVD.

One aspect of this description relates to a semiconductor device. The semiconductor device includes a substrate having a channel region and a source/drain region, a source/drain contact structure over the source/drain region, a conductive structure over the source/drain contact structure, an interlayer dielectric (ILD) layer surrounding the conductive structure and source/drain contact structure, a dielectric liner between the ILD layer and the conductive structure, and a diffusion barrier between the dielectric liner and the conductive structure.

Still another aspect of this description relates to a semiconductor device. The semiconductor device includes a gate stack having a gate electrode over a channel region of an active region of a substrate, a gate spacer alongside the gate stack, a source/drain region in the active region adjacent to the channel region, a source/drain contact structure over the source/drain region, a conductive structure over the source/drain contact structure and in contact with the source/drain contact structure, a diffusion barrier alongside the conductive structure and in contact with the source/drain contact structure, and a dielectric liner alongside the diffusion barrier and in contact with the source/drain contact structure.

Still another aspect of this description relates to a method for forming a semiconductor device. The method includes forming an interlayer dielectric (ILD) layer over a source/drain region, forming a source/drain contact structure in the ILD structure and over the source/drain region, removing a portion of the source/drain contact structure to form an opening above a remaining portion of the source/drain contact structure, forming dielectric liners on sidewalls of the opening, the dielectric liners having bottom surfaces in contact with the remaining portion of the source/drain contact structure, forming a glue layer on the dielectric liners, the remaining portion of the source/drain contact structure and the ILD layer, etching the glue layer to remove portions of the glue layer over the ILD layer and the remaining portion of the source/drain contact structure, and forming a conductive structure in the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate having a channel region and a source/drain region;
   a source/drain contact structure over the source/drain region, the source/drain contact structure comprising a first metal;
   a conductive structure over the source/drain contact structure, the conductive structure comprising a second metal;
   an interlayer dielectric (ILD) layer surrounding the conductive structure and the source/drain contact structure;
   a first layer between the ILD layer and the conductive structure, the first layer comprising a dielectric material; and
   a second layer between the first layer and the conductive structure, the second layer comprising a third metal.

2. The semiconductor device of claim 1, wherein the second layer is tapered such that a thickness of the second layer at a lower end thereof in contact with a surface of the source/drain contact structure is greater than a thickness of the second layer at an upper end thereof.

3. The semiconductor device of claim 1, wherein the conductive structure includes a first portion and a second portion overlying the first portion, wherein the second layer is on a sidewall of the first portion, and the first layer is on a sidewall of the second portion.

4. The semiconductor device of claim 3, wherein a width of the second portion of the conductive structure is greater than a width of the first portion of the conductive structure.

5. The semiconductor device of claim 1, wherein the source/drain contact structure has a top surface in contact with the conductive structure.

6. The semiconductor device of claim 1, wherein a top surface of the second layer is located below a top surface of the first layer.

7. The semiconductor device of claim 1, further comprising a gate stack over the channel region, wherein the gate stack comprises a gate dielectric in contact with the channel region and a gate electrode surrounded by the gate dielectric.

8. The semiconductor device of claim 7, wherein a top surface of the source/drain contact structure is located below a top surface of the gate electrode.

9. The semiconductor device of claim 7, further comprising a gate spacer on a sidewall of the gate stack.

10. A semiconductor device, comprising:
    a gate stack comprising a gate electrode over a channel region of an active region of a substrate;
    a gate spacer alongside the gate stack;
    a source/drain region in the active region adjacent to the channel region;
    a source/drain contact structure over the source/drain region;
    a conductive structure over the source/drain contact structure and in contact with a top surface of the source/drain contact structure;
    a diffusion barrier alongside the conductive structure and in contact with the source/drain contact structure; and
    a dielectric liner alongside the diffusion barrier and in contact with the source/drain contact structure,
    wherein the conductive structure has a first portion in direct contact with sidewalls of the diffusion barrier and a second portion in direct contact with sidewalls of the dielectric liner.

11. The semiconductor device of claim 10, further comprising a first via contact structure overlying and in contact with the gate electrode, and a second via contact structure overlying and in contact with the conductive structure.

12. The semiconductor device of claim 11, further comprising a contact level dielectric layer surrounding the first via contact structure and the second via contact structure.

13. The semiconductor device of claim 10, wherein a top surface of the diffusion barrier is located about 1 nm to 10 nm below a top surface of the dielectric liner.

14. The semiconductor device of claim 10, wherein the diffusion barrier has a rounded top corner.

15. The semiconductor device of claim 10, wherein a thickness of the diffusion barrier at a lower end thereof in contact with the source/drain contact structure is greater than a thickness of the diffusion barrier at an upper end thereof.

16. The semiconductor device of claim 10, wherein a thickness of the dielectric liner at a lower end thereof in contact with the source/drain contact structure is greater than a thickness of the dielectric liner at an upper end thereof.

17. A semiconductor device, comprising:
    an active region in a substrate
    a gate structure over the active region, the gate structure comprising a gate electrode and gate spacers on sidewalls of the gate electrode;
    a first source/drain region and a second source/drain region in the active region on opposite sides of the gate structure;
    an interlayer dielectric (ILD) layer over the substrate to laterally surround the gate structure;
    a first contact embedded in the ILD layer and connected to the first source/drain region; and
    a second contact embedded in the ILD layer and connected to the second source/drain region,
    wherein each of the first contact and the second contact comprises:
       a source/drain contact structure in direct contact with a top surface of a corresponding first or second source/drain region;
       a conductive structure over the source/drain contact structure;
       a dielectric liner between the ILD layer and the conductive structure; and
       a diffusion barrier sandwiched between sidewalls of a lower portion of the conductive structure and the dielectric liner,
       wherein the dielectric liner is sandwiched between sidewalls of the diffusion barrier and sidewalls of the ILD layer, and
       wherein an upper portion of the conductive structure is free of the diffusion barrier.

18. The semiconductor device of claim 17, wherein the source/drain contact structure is in direct contact with the ILD layer.

19. The semiconductor device of claim 17, wherein the source/drain contact structure comprises a first conductive material, and the conductive structure comprises a second conductive material different from the first conductive material.

20. The semiconductor device of claim 19, wherein the diffusion barrier comprises a third conductive material different from the second conductive material.

* * * * *